(12) United States Patent
Ha et al.

(10) Patent No.: US 10,993,341 B2
(45) Date of Patent: Apr. 27, 2021

(54) ELECTRONIC DEVICE INCLUDING WINDOW

(71) Applicant: Samsung Electronics Co., Ltd., Gyeonggi-do (KR)

(72) Inventors: Do-Hyung Ha, Seoul (KR);
Seong-Hoon Kim, Seoul (KR);
Min-Sung Lee, Gyeonggi-do (KR);
Hyung-Sup Byeon, Gyeonggi-do (KR);
Dong-Hyun Yeom, Gyeonggi-do (KR);
Min-Woo Yoo, Gyeonggi-do (KR);
Hyun-Ju Hong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/011,799

(22) Filed: Jun. 19, 2018

(65) Prior Publication Data

US 2018/0368274 A1 Dec. 20, 2018

(30) Foreign Application Priority Data

Jun. 19, 2017 (KR) .................. 10-2017-0077269

(51) Int. Cl.
*H05K 5/03* (2006.01)
*H05K 5/00* (2006.01)
*H04M 1/02* (2006.01)

(52) U.S. Cl.
CPC ............ *H05K 5/03* (2013.01); *H04M 1/0202* (2013.01); *H04M 1/0283* (2013.01); *H05K 5/0004* (2013.01); *H05K 5/0017* (2013.01)

(58) Field of Classification Search
CPC ...... H05K 5/03; H05K 5/0004; H05K 5/0017; H04M 1/0202; H04M 1/0283
See application file for complete search history.

(56) References Cited

U.S. PATENT DOCUMENTS 4,882,115 A * 11/1989 Schmickl ................. H01G 9/08
361/538
2008/0227507 A1 9/2008 Joo
(Continued)

FOREIGN PATENT DOCUMENTS

EP 0321047 A2 12/1988
EP 3054655 A1 8/2016
(Continued)

OTHER PUBLICATIONS

International Search Report dated Sep. 28, 2018.
European Search Report dated May 4, 2020.

*Primary Examiner* — James Wu
*Assistant Examiner* — Hung Q Dang
(74) *Attorney, Agent, or Firm* — Cha & Reiter, LLC.

(57) ABSTRACT

An electronic device according to an embodiment may include a housing, which includes a front structure and a rear structure attached to each other, and a touch screen display. The front structure of the housing may include a first plate facing a first direction and a side plate extending from the first plate. The first plate may have a first thickness. The side plate may have a second thickness larger than the first thickness. The side plate may include a first surface facing a peripheral portion of the rear structure. The rear structure may include a second plate facing a second direction opposite the first direction and a second surface facing the first surface. The first surface may face a third direction. The second surface may face a fourth direction. The third and fourth directions may be configured to differ from the first and second directions, respectively. The touch screen display may have at least a part exposed through at least a part of the first plate. Other various embodiments may be possible.

14 Claims, 10 Drawing Sheets

(56) References Cited

U.S. PATENT DOCUMENTS

| | | |
|---|---|---|
| 2011/0069027 A1 | 3/2011 | Kim et al. |
| 2012/0074005 A1 | 3/2012 | Johnson et al. |
| 2012/0287066 A1 | 11/2012 | Yang et al. |
| 2013/0169891 A1* | 7/2013 | Hirashima ............... H04N 5/64 348/836 |
| 2015/0342064 A1 | 11/2015 | Russell-Clarke et al. |
| 2016/0227653 A1 | 8/2016 | Kim et al. |
| 2018/0299925 A1 | 10/2018 | Honma et al. |
| 2018/0364760 A1* | 12/2018 | Ahn ..................... G06F 1/1652 |

FOREIGN PATENT DOCUMENTS

| | | |
|---|---|---|
| KR | 10-2012-0127038 A | 11/2012 |
| KR | 10-2016-0097106 A | 8/2016 |
| KR | 10-1646508 B1 | 8/2016 |
| WO | 2017/047439 A1 | 3/2017 |

\* cited by examiner

ELECTRONIC DEVICE INCLUDING WINDOW

CROSS-REFERENCE TO RELATED APPLICATION

This application is based on and claims priority under 35 U.S.C. § 119 of Korean Patent Application No. 10-2017-0077269, filed on Jun. 19, 2017, in the Korean Intellectual Property Office, the disclosure of which is incorporated herein by reference in its entirety.

BACKGROUND

1. Field

The present disclosure relates to an electronic device according to various embodiments and, more particularly, to an electronic device having a front structure made of a light-transmitting material and arranged in the front and side areas of the device.

2. Description of the Related Art

With the remarkable development of information and communication technologies and semiconductor technologies, electronic devices such as smartphones have become commonplace. These electronic devices may be portable and may communicate with other devices via various methods or protocols.

The term "electronic devices" as used herein may refer not only to smartphones but also home appliances, as electronic diaries, portable multimedia players, other mobile communication terminals, tablet PCs, video/audio devices, desktop/laptop computers, navigation systems for vehicles, etc. These electronic devices may output audio, images, and/or video content. As the result of the high degree of integration of electronic devices and widespread use of high-speed large-capacity wireless communication, it has recently become possible to equip a single electronic device, such as a mobile communication terminal, with various functions. For example, a single electronic device may perform function such as entertainment function, such as executing a video game, multimedia function, such reproduction of music/video files, communication and security functions for mobile banking, scheduling function, electronic wallet function, communication function, etc. Such electronic devices are becoming more compact so that they are readily portable.

In line with these trends, housings and/or window covers that cover electronic devices have been developed to have various shapes and functions. Such housings and/or window covers are designed not only with aesthetics in mind, but also designed to be function. For example, these housings and/or window covers may be designed to maximize the interior mounting spaces of the electronic devices.

SUMMARY

Accordingly to various embodiments disclosed herein, an electronic device (for example, a portable terminal) may include a window cover that faces in the forward direction and/or in a lateral direction. In order for the window cover having the above structure and the housing of the electronic device to be coupled to each other, the housing is fabricated to extend to the side area in the lateral direction, and the window cover is inserted into the side surface of the housing. This may reduce the structural rigidity of the housing.

In another example, in order for the window cover and the housing of the electronic device to be coupled to each other, end portions of the cover and the housing may be arranged to face each other, and a tape or the like may be used to couple the two. However, if the window cover and the housing are assembled this way, they may easily come apart, and dust or water may easily enter the interior of the electronic device.

An electronic device including a window cover according to various embodiments is configured to implement a structure for providing rigidity when the window cover, which is formed to bend toward side surfaces of the electronic device, and the housing are coupled to each other.

An electronic device including a window cover according to various embodiments is configured to such that, when the window cover and the housing are coupled to each other, the coupling structure is not visible, thereby providing a better aesthetic appearance of the electronic device.

An electronic device according to an embodiment may include: a housing including a front structure and a rear structure attached to each other; and a touch screen display. The front structure includes a first plate facing a first direction and a side plate extending from the first plate, the first plate has a first thickness, the side plate has a second thickness larger than the first thickness, the side plate includes a first surface facing a peripheral portion of the rear structure, the rear structure includes a second plate facing a second opposite the first direction and a second surface facing the first surface, the first surface faces a third direction, the second surface faces a fourth direction, the third and fourth directions are different from the first and second directions, respectively. The touch screen display has at least a part exposed through at least a part of the first plate.

An electronic device according to an embodiment may include: a front structure including a first plate facing a first direction, a first side plate perpendicular to the first plate, and a second side plate perpendicular to the first plate; a rear structure coupled to end portions of the first and second side plates; a support member arranged inside the front structure so as to support the front structure, the support member having a shape corresponding to the front structure and is coupled to the rear structure; and a display device arranged between the front structure and the rear structure so as to display information through the front structure. The rear structure includes one or more first end portions having varying heights in the first direction, and the first side plate and the second side plate each includes one or more second end portions having varying heights corresponding to the one or more first end portions, so as to be coupled to the one or more first end portions.

An electronic device according to an embodiment may include: a front structure including a first plate facing a first direction, a first side plate perpendicular to the first plate, and a second side plate perpendicular to the first plate; a rear structure coupled to end portions of the first and second side plates; a support member arranged inside the front structure so as to support the front structure, the support member having a shape corresponding to the front structure and coupled to the rear structure; one or more side members arranged between the first side plate and the second side plate of the front structure and side portions of the support member, respectively; and a display device arranged between the front structure and the support member so as to display information through the front structure. The rear structure includes one or more first end portions having varying heights in the first direction, and the side members include one or more second end portions having varying heights corresponding to the one or more first end portions, so as to be coupled to the first end portions.

An electronic device including a front structure according to various embodiments is configured such that corresponding end portions of the front structure and the rear structure are contact-coupled, respectively, thereby inducing rigid coupling.

An electronic device including a front structure according to various embodiments is configured such that adhesive materials arranged on coupling surfaces of the front structure and of the rear structure are not visible, thereby providing a better aesthetic appearance of the electronic device.

An electronic device including a front structure according to various embodiments is configured such that three outer surfaces of the electronic device constitute the front structure, thereby providing a simple and aesthetic design.

An electronic device according to one embodiment is designed so that a rear cover is not necessary, which in turn increases the mounting space within the electronic device.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
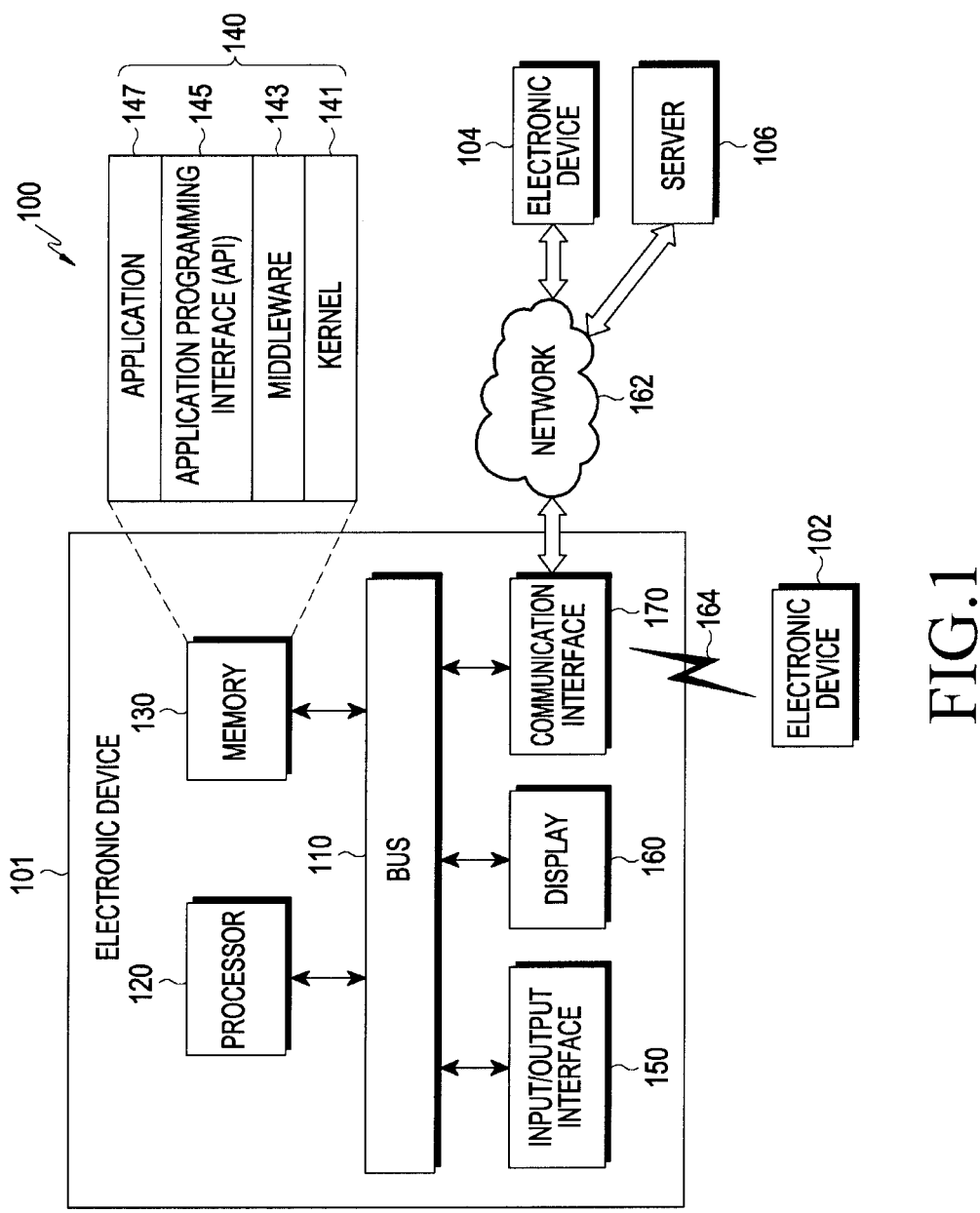
FIG. 1 illustrates an electronic device 101 in a network environment 100 according to an embodiment.

Hereinafter, various embodiments will be described with reference to the accompanying drawings. However, it should be understood that there is no intent to limit the present disclosure to the particular forms disclosed herein. Rather, the present disclosure should be construed to cover various modifications, equivalents, and/or alternatives of embodiments that are apparent to one or ordinary skill in the art. In describing the drawings, similar reference numerals may be used to designate similar constituent elements.

As used herein, the expression "have," "may have," "include," or "may include" refers to the existence of a corresponding feature (e.g., numeral, function, operation, or constituent element such as component), and does not exclude one or more additional features.

In the present disclosure, the expression "A or B," "at least one of A or/and B," or "one or more of A or/and B" may include all possible combinations of the items listed. For example, the expression "A or B," "at least one of A and B," or "at least one of A or B" refers to all of (1) including at least one A, (2) including at least one B, or (3) including all of at least one A and at least one B.

The expression "a first," "a second," "the first," or "the second" may refer to corresponding components without implying an order of importance, and are used merely to distinguish each component from the others without unduly limiting the components. For example, a first user device and a second user device indicate different user devices although both of them are user devices For example, a first element may be termed a second element, and similarly, a second element may be termed a first element without departing from the scope of the present disclosure It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for," "having the capacity to," "designed to," "adapted to," "made to," or "capable of," depending on the context. The term "configured to" may not necessarily imply "specifically designed to" in hardware. Alternatively, in some situations, the expression "device configured to" may mean that the device, together with other devices or components, "is able to." For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

The terms used herein are merely for the purpose of describing particular embodiments and are not intended to limit the scope of other embodiments A singular expression may include the corresponding plural unless the context clearly indicates otherwise. Unless defined otherwise, all terms used herein, including technical and scientific terms, have the same meaning as those commonly understood by a person skilled in the art to which the present disclosure pertains. In some cases, even a term explicitly defined in the present disclosure should not be interpreted to exclude the disclosed embodiments.

An electronic device according to various embodiments may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to an embodiment, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit).

According to some embodiments, the electronic device may be a home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA) device, a Magnetic Resonance Imaging (MRI) device, a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In an embodiment, the electronic device may be a combination of one or more of the aforementioned various devices. According to some embodiments, the electronic device may also be a flexible device. Further, the electronic device according to an embodiment is not limited to the aforementioned devices, and may include a new electronic device according to the development of technology.

Hereinafter, an electronic device according to an embodiment will be described with reference to the accompanying drawings. In the present disclosure, the term "user" may indicate a person using an electronic device or a device (e.g., an artificial intelligence electronic device) using an electronic device.

Referring to FIG. 1, an electronic device 101 within a network environment 100 according to an embodiment will be described. The electronic device 101 may include a bus 110, a processor 120, a memory 130, an input/output interface 150, a display 160, and a communication interface 170. In some embodiments, the electronic device 101 may omit at least one of the elements, or may further include other elements. The bus 110 may include, for example, a circuit that interconnects the elements 110 to 170 and transmits communication (for example, control messages or data) between the elements. The processor 120 may include one or more of a central processing unit, an application processor, and a communication processor (CP). The processor 120, for example, may carry out operations or data processing relating to the control or communication of at least one other element of the electronic device 101. The processor 120 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

The memory 130 may include a volatile or non-volatile memory. The memory 130 may store, for example, instructions or data relevant to at least one other element of the electronic device 101. According to an embodiment, the memory 130 may store software or a program 140. The program 140 may include, for example, a kernel 141, middleware 143, an application programming interface (API) 145, or application programs (or "applications") 147. At least some of the kernel 141, the middleware 143, and the API 145 may be referred to as an operating system. The kernel 141 may control or manage system resources (for example, the bus 110, the processor 120, or the memory 130) used for executing an operation or function implemented by other programs (for example, the middleware 143, the API 145, or the application program 147). Furthermore, the kernel 141 may provide an interface through which the middleware 143, the API 145, or the application programs 147 may access the individual elements of the electronic device 101 to control or manage the system resources.

The middleware 143 may function as, for example, an intermediary for allowing the API 145 or the application programs 147 to communicate with the kernel 141 to exchange data. Furthermore, the middleware 143 may process one or more task requests, which are received from the application programs 147, according to priorities thereof. For example, the middleware 143 may assign priorities for using the system resources (for example, the bus 110, the processor 120, the memory 130, or the like) of the electronic device 101 to one or more of the application programs 147, and may process the one or more task requests. For example, the input/output interface 150 may forward instructions or data, input from a user or an external device, to the other element(s) of the electronic device 101, or may output instructions or data, received from the other element(s) of the electronic device 101, to the user or the external device.

The display 160 may include, for example, a Liquid Crystal Display (LCD), a Light Emitting Diode (LED) display, an Organic Light Emitting Diode (OLED) display, a Micro Electro Mechanical System (MEMS) display, or an electronic paper display. The display 160 may display, for example, various types of contents (for example, texts, images, videos, icons, symbols, and the like) for a user. The display 160 may include a touch screen and may receive, for example, a touch, gesture, proximity, or hovering input using an electronic pen or the user's body part. The communication interface 170, for example, may set communication between the electronic device 101 and an external device (e.g., a first external electronic device 102, a second external electronic device 104, or a server 106). For example, the communication interface 170 may be connected to a network 162 through wireless or wired communication to communicate with the external device (for example, the second external electronic device 104 or the server 106).

The wireless communication may include, for example, a cellular communication that uses at least one of LTE, LTE-Advance (LTE-A), code division multiple access (CDMA), wideband CDMA (WCDMA), universal mobile telecommunications system (UMTS), wireless broadband (WiBro), global system for mobile communications (GSM), or the like. According to an embodiment, the wireless communication may include, as indicated by element 164 in FIG. 1, at least one selected from WiFi (wireless fidelity), LiFi (light fidelity), Bluetooth, Bluetooth Low Energy (BLE), ZigBee, NFC (near field communication), magnetic secure transmission, radio frequency (RF), or body area network (BAN). According to an embodiment, the wireless communication may include a GNSS. The GNSS may be, for example, GPS (global positioning system), Glonass (global navigation satellite system), Beidou navigation satellite system (hereinafter, referred to as "Beidou") or Galileo, the European global satellite-based navigation system. Hereinafter, in this document, the term "GPS" may be interchangeable with the term "GNSS". The wired communication may include, for example, at least one of a Universal Serial Bus (USB), a High Definition Multimedia Interface (HDMI), Recommended Standard 232 (RS-232), power line communication, a Plain Old Telephone Service (POTS), and the like. The network 162 may include a telecommunications network, for example, at least one of a computer network (for example, a LAN or a WAN), the Internet, and a telephone network.

Each of the first and second external electronic devices 102 and 104 may be of the same or a different type from the electronic device 101. According to various embodiments, all or some of the operations performed in the electronic device 101 may be performed in another electronic device or a plurality of electronic devices (e.g., the electronic devices 102 and 104 or the server 106). According to an embodiment, when the electronic device 101 has to perform some functions or services automatically or in response to a request, the electronic device 101 may make a request for performing at least some functions relating thereto to another device (for example, the electronic device 102 or 104 or the server 106) instead of performing the functions or services by itself or in addition thereto. Another electronic device (for example, the electronic device 102 or 104 or the server 106) may execute the requested functions or the additional functions, and may deliver a result of the execution to the electronic device 101. The electronic device 101 may provide the received result as it is, or may additionally process the received result to provide the requested functions or services. To this end, for example, cloud computing, distributed computing, or client-server computing technology may be used.

Figure 2A:
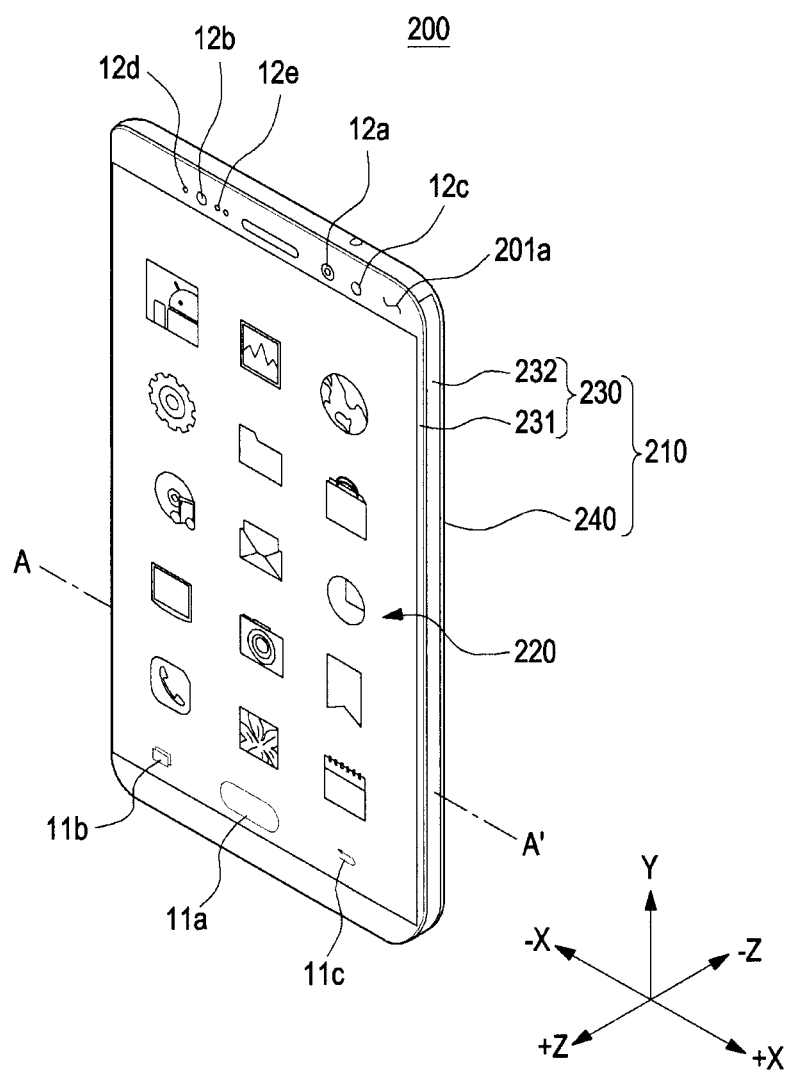
FIG. 2A is a perspective view illustrating an electronic device 200 facing forward according to an embodiment.
Figure 2B:
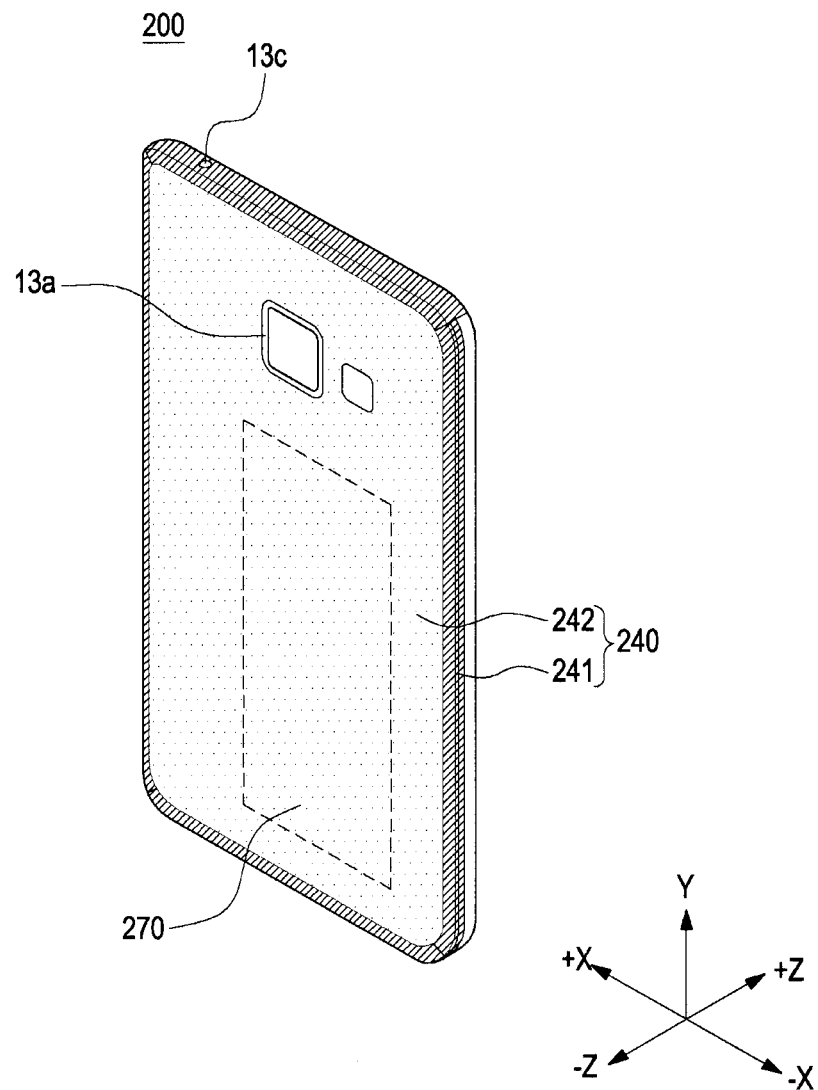
FIG. 2B is a perspective view illustrating the electronic device 200 facing a backwards direction according to an embodiment.

FIG. 2A is a perspective view illustrating an electronic device 200 facing forward according to one of various embodiments. FIG. 2B is a perspective view illustrating the electronic device 200 facing a backwards direction according to one of various embodiments.

The electronic device 200 illustrated in FIG. 2A and FIG. 2B may have the same structure, partially or entirely, as that of the electronic device 101 illustrated in FIG. 1.

In FIG. 2A and FIG. 2B, "X-axis" of the three-axis orthogonal coordinate system may refer to the width direction of the electronic device 200, "Y-axis" may refer to the longitudinal direction of the electronic device 200, and "Z-axis" may refer to the thickness direction of the electronic device 200. In an embodiment, "Z-axis" may include a first direction (+Z) and/or a second direction (−Z).

As illustrated in FIG. 2A and FIG. 2B, the electronic device 200 may include a housing 210 and a display device 220. The housing 210 may include a front structure 230 and a rear structure 240. The display device 220 may be arranged such that at least a part thereof is exposed through at least a part of the front structure 230.

According to an embodiment, the front structure 230 of the electronic device 200 may include a first plate 231 facing in the first direction (+Z) and at least one side plate 232 extending from the first plate 231 in the (−Z) direction. According to an embodiment, one side area of the display device 220 exposed through the first plate 231 of the front structure 230 may include a touch area 11a, 11b, and 11c that can generate input signals in response to contact by the user's body. The electronic device 200 may provide various screens displayed by the display device 220 in response to various touch inputs from the user.

According to an embodiment, the housing 210 is used to house or contain various electronic components of the electronic device 200. At least a part of the housing 210 may be made of a conductive material. For example, the housing 210 may include side members that form the outer lateral surface of the electronic device 200, and at least a part of the side members may be made of a conductive metal material. A printed circuit board (not illustrated) and/or a battery 270 may be contained in the housing 210. For example, a processor, a communication module, various interfaces (for example, interfaces 150 and 170 illustrated in FIG. 1), a power management module, or the like may be mounted on the printed circuit board as an integrated circuit chip. As another example, a control circuit may also be configured as an integrated circuit chip and mounted on the printed circuit board. For example, the control circuit may be a part of the above-mentioned processor or communication module. Power supply can be secured from the battery 270, which is housed in the housing 210.

Although not illustrated in detail in the drawings, according to an embodiment, various structures may be formed on the surface of or inside the housing 210 depending on the arrangement of electronic components arranged in the electronic device 200 or the like. For example, a space for containing integrated circuit chips mounted on the printed circuit board may be formed in the housing 210. The space for containing integrated circuit chips may be formed as a recessed shape or by a rib that surrounds the integrated circuit chips.

According to an embodiment, the front structure 230 may include a side plate 232 which faces a direction substantially perpendicular to the first direction (+Z) from the first plate 231, and which extends from both lateral ends of the first plate 231 (e.g. the left and right side of the first plate 231) to form at least a part of the lateral side surface of the electronic device. Accordingly, the front structure 230 may form at least three surfaces of the electronic device. The first plate 231 and the side plate 232, which constitute the front structure 230, may be made of material such as tempered glass or synthetic resin that can transmit light, radio waves, or magnetic fields.

According to an embodiment, the front upper end or lower end of the front structure 230 may include various types of holes such that partial areas of the various electronic components housed in the housing 210 are exposed to the exterior of the electronic device 200. For example, a first camera 12a, a light source 12b, and/or an iris camera 12c may be arranged in the front upper-end area 201a of the electronic device 200. The light source 12b may be an IR LED, and the iris camera 12c may recognize iris information in an infrared image of the user's eye that is captured using the red near-infrared rays from the IR LED. As another example, the front upper-end area of the electronic device 200 may include a light source portion display lamp 12d and a luminance sensor or a proximity sensor 12e. As yet another example, the rear or side area of the electronic device 200 may include a second camera 13a, a heart rate monitor (HRM), a flash, and/or a speaker 13c. As yet another example, a side touch key may be arranged in a partial area of the side plate 232. The portion of the side plate 232 housing the side key may be a hole corresponding to the side key, such that the side key is a physical button.

According to an embodiment, the display device 220 may be exposed through at least a partial area of the front structure 230. The display device 220 may include a display panel made of tempered glass mounted on the interior surface of the front structure 230. A touch panel may be mounted between the front structure 230 and the display panel. For example, the display device 220 may be utilized as an output device for outputting content and/or also as an input device for accepting touch inputs. In other words, the display device 220 may be a touch screen.

According to an embodiment, the electronic device 200 may include a rear structure 240 that protects the rear of the housing 210. At least a part of the rear structure 240 may be mounted in the opposite direction to the display device 220 (for example, in the second direction (−Z)). The rear structure 240 may include a second plate 241 that partially covers both the side surfaces and the rear surface of the electronic device 200, and a rear cover 242 that faces the second direction (−Z). In one example, the rear structure 240 may be made of a material that can transmit radio waves or magnetic fields, such as tempered glass or synthetic resin. As another example, the rear structure 240 may be made of metal. The rear structure 240 may constitute the exterior of the electronic device 200 together with the front structure and the display device 220.

Figure 3A:
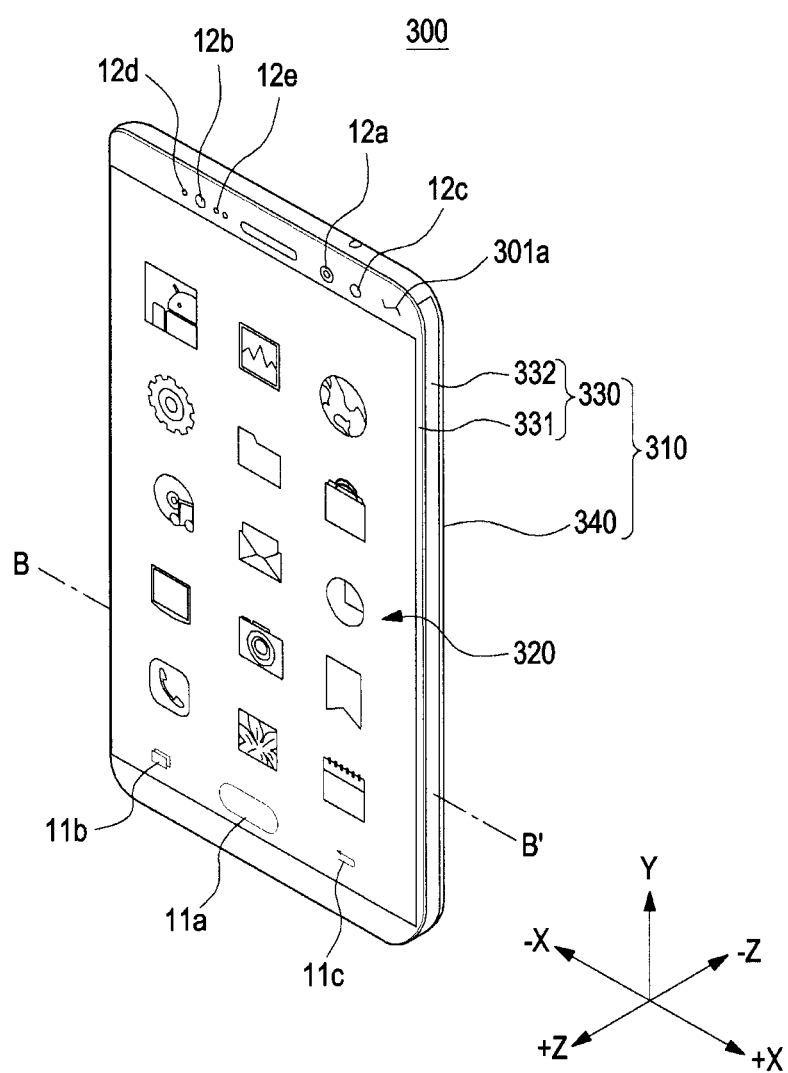
FIG. 3A is a perspective view illustrating an electronic device 300 facing forward according to an embodiment.
Figure 3B:
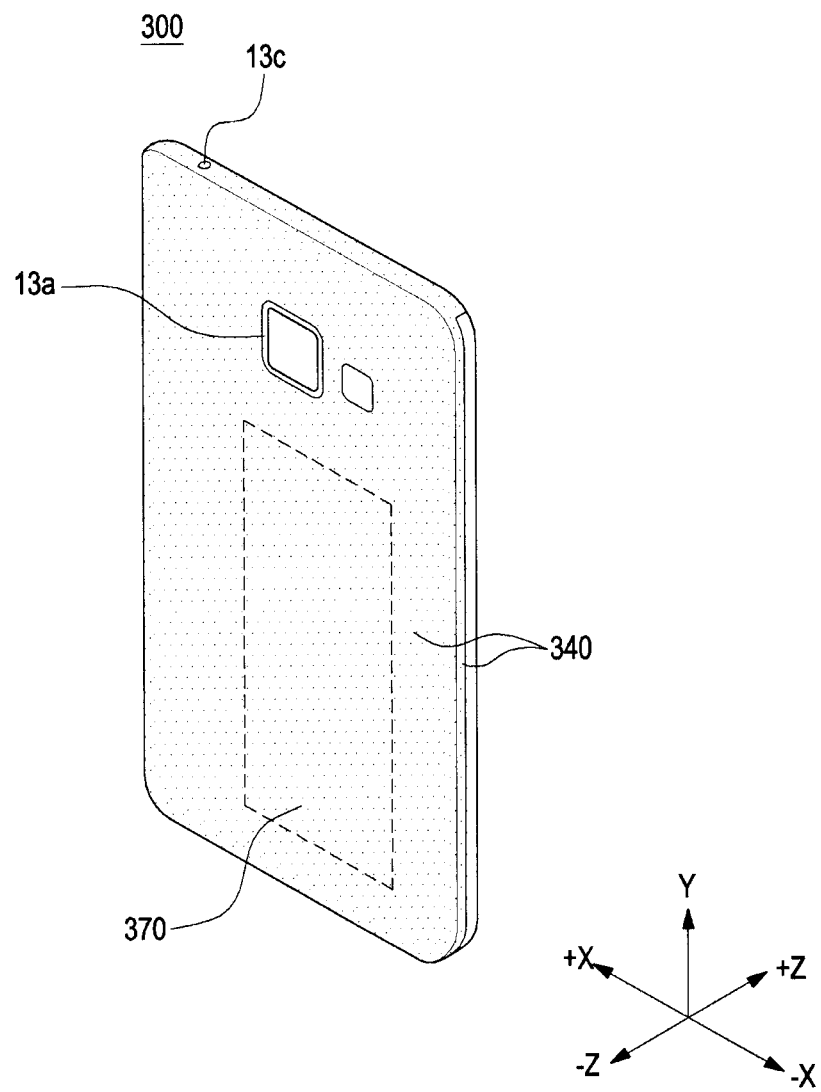
FIG. 3B is a perspective view illustrating the electronic device 300 facing a backwards direction according to an embodiment.

FIG. 3A is a perspective view illustrating an electronic device 300 facing forward according to one of an embodiment. FIG. 3B is a perspective view illustrating the electronic device 300 facing a backwards direction according to one of an embodiment.

In FIG. 3A and FIG. 3B, "X-axis" of the three-axis orthogonal coordinate system may refer to the width direction of the electronic device 300, "Y-axis" may refer to the longitudinal direction of the electronic device 300, and "Z-axis" may refer to the thickness direction of the electronic device 300. Furthermore, in an embodiment, "Z-axis" may include a first direction (+Z) or a second direction (−Z). As illustrated in FIG. 3A and FIG. 3B, the electronic device 300 may include a housing 310 and a display device 320. The housing 310 may include a front structure 330 and a rear structure 340. The display device 320 may be arranged such that at least a part thereof is exposed through at least a part of the front structure 330.

One or more parts of the configuration of the housing 310 of the electronic device 300 and the configuration of the display device 320, illustrated in FIG. 3A and FIG. 3B, may be substantially identical to parts of the configuration of the housing 210 and the structure of the display device 220, illustrated in FIG. 2A and FIG. 2B. Accordingly, duplicative descriptions thereof may be omitted.

According to an embodiment, the housing 310 is used to house or contain various electronic components of the electronic device 300. At least a part of the housing 310 may be made of a conductive material. The rear structure 340 of the housing 310 may be fabricated as an integrated body formed to extend to at least a partial area of a side surface of the electronic device 300 and to extend from the side surface to the rear area that faces the second direction (−Z). Thus, for example, the rear structure 340 replaces the rear cover 240 illustrated in FIG. 2B, and the rear structure 340 can cover both the rear surface and the partial area of the side surface of the electronic device 300.

Hereinafter, a structure for coupling between the front structure and the rear structure, which face the front and side surfaces of the electronic device, will be described. The structure may allow the housing of the electronic device to be rigid.

Figure 4A:
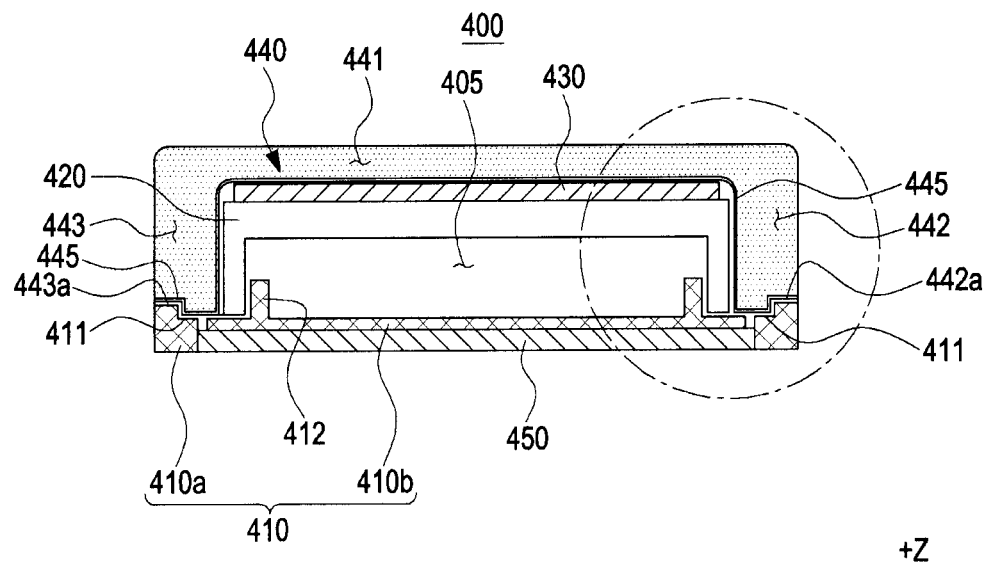
FIG. 4A is a sectional view of the electronic device 200 according to an embodiment, taken along A-A' of FIG. 2A.
Figure 4B:
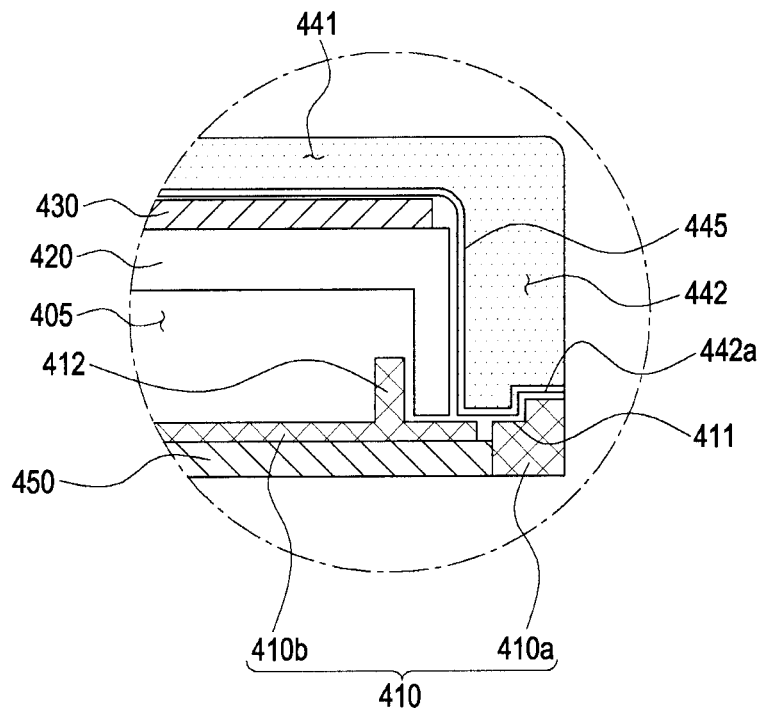
FIG. 4B is a magnified sectional view of a partial area of FIG. 4A.

FIG. 4A is a sectional view of the electronic device 200 according to an embodiment, taken along A-A' of FIG. 2A. FIG. 4B is a magnified sectional view of a partial area of FIG. 4A.

The electronic device 400 illustrated in FIG. 4A and FIG. 4B may be partially or entirely identical to the electronic device 200 illustrated in FIG. 2A and FIG. 2B.

Referring to FIG. 4A and FIG. 4B, the electronic device 400 may include a housing 410, 440, and 450, a display device 430, and a support member 420. The housing 410, 440, 450 may include rear structures 410 and 450 that at least partially cover the outer rear surface of the electronic device 400. The housing 410, 440, 450 may also include a front structure 440. The electronic device 400 may include a support member 420 that supports various components inside the electronic device.

According to an embodiment, as shown in FIG. 4A, the display device 430, the support member 420, an inner space 405, the second plate 410, and the rear cover 450 may be arranged sequentially in the second direction (−Z) starting from the front structure 440. The front structure 440, the display device 430, and the support member 420 may be stacked above the inner space 405. The second plate 410 and the rear cover 450 may be stacked below the inner space 405.

According to an embodiment, the second plate 410 may include a first part 410a that forms the lower-end portion of the outer surface of the electronic device 400 and a second part 410b that extends from the first part 410a and forms the inner surface of the electronic device 400.

For example, referring to FIG. 4B, the first surface of the front structure 440, which faces the second direction (−Z), and the second surface of the rear structures 410 and 450, which face the first direction (+Z), may face each other. As another example, the second surface of the first part 410a, which faces the second direction (−Z), may be arranged to be collinear with the rear cover 450 of the electronic device 400. Thus, the two can form at least a part of the rear surface of the electronic device 400. The first part 410a may include at least one ledge 411.

A surface of the first part 410a, which faces in the +X direction, may be arranged to be collinear with the first side plate 442 of the front structure 440, thereby forming at least a part of a side surface of the electronic device 400. According to an embodiment, the first surface of the first part 410a, which faces in the first direction (+Z), may include a ledge 411. The ledge 411 may be coupled with the front structure 440 and support the front structure 440 such that the front structure 440 does not deviate in an outward direction (for example, +X direction). For example, the ledge 411 of the first part 410a may be manufactured in the shape of a step, the outer side of which protrudes in the first direction (+Z), and may be formed as a single ledge-shaped line along the longitudinal direction of the electronic device 400 (for example, in the Y-axis direction of the electronic device 200 in FIG. 2).

According to an embodiment, the second part 410b may be arranged to extend from the first part 410a, and may form the inner space 405, in which an internal electronic component or the like is mounted, together with the support member 420. The second plate 410 and the support member 420 may be arranged to entirely surround the inner space 405 so as to protect the electronic components or the like arranged in the inner space 405. The first surface of the second part 410b, which faces the first direction (+Z), may be arranged toward the interior of the inner space 405, and the second surface of the second part 410b, which faces the second direction (−Z), may be arranged to face the rear cover 450.

According to an embodiment, the first surface of the second part 410b may include protrusions 412 (for example, in rib shapes) arranged to extend and protrude in the first direction (+Z). The protrusions 412 may be arranged at both ends of the second part 410b so as to form lines in the longitudinal direction of the electronic device 400. For example, referring to FIG. 4B, the protrusions 412 may be ledges that work in conjunction with the ledges of the first part 410a.

According to an embodiment, coupling between the ledges 411 of the first part 410a and the protrusion 412 of the second part 410b may form recesses with a predetermined size on the first surface (the surface in the (+Z) direction) of the second plate 410. For example, referring to FIG. 4B, the protrusions 412 arranged on the first surface of the second part 410b may be configured to have "└"shapes, and the ledges 411 of the first part 410a may be configured to have "⌐" shapes. Side end portions of the support member 420 and the front structure 440 may be at least partially inserted into the recesses generated between the ledges 411 and the protrusions 412. The recesses may have the shape of "⊔" such that the support member 420 and the front structure 440 are prevented from moving in the leftward/rightward direction. Although the coupling configuration in FIG. 4B illustrates the shape of the right surface of the electronic device 400, the left surface of the electronic device 400 may also be similarly configured.

According to an embodiment, the support member 420 may be arranged inside the electronic device 400 so as to define the inner space 405 together with the second plate 410. The first surface of the support member 420, which faces the first direction (+Z), may have a seating surface formed thereon, on which the display device 430 is seated. This way, the support member can support the front structure 440 together with the display device 430.

According to an embodiment, the support member 420 may have side portions formed to extend from both ends (i.e. left and right) of the seating surface in the downward direction (for example, in the second direction (−Z)). For example, as shown in FIG. 4A, the support member 420 may be manufactured in a "⌐" shape. The two side portions may be inserted into the recesses formed by the ledges 411 and the protrusions 412 of the second plate 410 and be fixedly supported therein.

According to an embodiment, the front structure 440 may be exposed to the exterior of the electronic device 400 and may protect the display device 430. The front structure 440 may cover at least a partial area of the front surface of the electronic device 400 and at least a partial area of the side surface thereof. For example, the front structure 440 may include a first plate 441 that faces the first direction (+Z) and side plates (for example, a first side plate 442 and a second side plate 443) facing the +X direction and −X direction, respectively, which are perpendicular to the first direction (+Z). The first side plate 442 and the second side plate 443 may be arranged to face opposite directions. According to an embodiment, the side plates 442 and 443 may include first surfaces that face the peripheral portion of the rear structure, and the first surfaces may include one or more ledges 442a and 443a.

As another example, the first side plate 442 and second side plate 443 may be integrally formed in the front structure 440 by bending the peripheral portions of the first plate 441 by at least by 90°. The first side plate 442 and second side plate 443 may be arranged to couple to the second plate 410. For example, as shown in FIG. 4A, the front structure 440 may be manufactured in a substantially "⌐" shape. The first side plate 442 and second side plate 443 may be inserted into the recesses of the second plate 410 and retained therein.

According to an embodiment, the first side plate 442 and the second side plate 443 of the front structure 440 may constitute at least about ⅔ of the outer side surface of the electronic device. However, the side extension configuration is not limited thereto, and the size of the first side plate 442 and the second side plate 443 may be changed depending on the design of the electronic device.

According to an embodiment, end portions of the first side plate 442 and the second side plate 443 of the front structure 440 may be inserted into the recesses formed by the second plate 410 and retained therein. For example, the lower end portions of the first side plate 442 and the second side plate 443 may have ledges 442a and 443a manufactured in shapes corresponding to those of the ledges 411 formed on the first part 410a of the second plate 410 and fitted thereto.

As shown in more detail in FIG. 4B, an end portion of the first side plate 442, for example, may have a surface facing the second direction (−Z). The surface include ledges 442a, and the ledges 442a may be coupled to the ledges 411 of the second plate. For example, the ledges 442a of the first side plate 442 may be manufactured in the shape of steps, the outer areas of which concave upward. A single ledge-shaped line may be formed along the longitudinal direction of the electronic device 400. As another example, the ledges 442a of the first side plate 442 may have a "Γ" shape. The ledges 442a of the front structure 440 and the lower end portions of the support member 420 may be together inserted into the groove-shaped recesses of the second plate 410.

According to an embodiment, a shielding printed layer 445 may be arranged from at least a partial area (including, for example, an area that can overlap with the display device 430) of the first plate 441 of the front structure 440 along an inner periphery line of the first side plate 442. As another example, a shielding printed layer 445 may be arranged from at least a partial area (including, for example, an area that can overlap with the display device 430) of the first plate 441 of the front structure 440 along an inner periphery line of the second side plate 443. The shielding printed layer 445 may prevent the inner components of the electronic device and the support member 420 from being seen from the outside of the electronic device, thereby providing a better aesthetic appearance for the device. Referring to FIG. 4B, a side portion of the support member 420 is arranged next to an inner surface of the first side plate 442 (for example, the surface of the first side plate 442 facing the −X direction), and the inner surface of the first side plate 442 and the side portion of the support member 420 may be arranged in parallel with each other.

Although the coupling configuration in FIG. 4B illustrates the shape of the right surface of the electronic device 400, the left surface of the electronic device 400 may be similarly configured such that the second side plate 443 of the front structure 440, the second plate 410, and the support member 420 are coupled in a corresponding manner. In addition, although the front structure 440 has been described with regard to structures of three surfaces 441, 442, and 443 that are bent at right angles, the front structure 440 is not limited thereto and may have curved surfaces such that the front surface 441 and the side surfaces 442 and 443 are at other angles.

According to an embodiment, the thickness of first plate 441 of the front structure 440 may be different from the thickness of the first side plate 442 and the second side plate 443. For example, the thickness of the first plate 441 may be smaller than the thickness of the first side plate 442 and the second side plate 443. The increased thickness of the first side plate 442 and the second side plate 443 may result in more rigidity for the housing of the electronic device 400.

According to an embodiment, the rear cover 450 of the rear structure may be arranged on the outer surface of the electronic device 400 so as to protect internal components of the electronic device 400 or the like. For example, the rear cover 450 may be seated in a recess formed by the second plate 410. For example, the rear cover 450 may have a plate shape, and may be made of a material such as tempered glass or synthetic resin that can transmit radio waves or magnetic fields. As another example, the rear cover 450 may be metallic.

Although an embodiment of the electronic device 400 including the rear cover 450 has been described, the electronic device 400 is not limited thereto, and it can be understood from the present disclosure that the second plate 410 can be manufactured so as to substantially cover the rear surface of the electronic device as illustrated in FIG. 3A and FIG. 3B. The second plate 410 can also form at least a part (for example, side and rear surfaces) of the housing of the electronic device 400.

According to an embodiment, the display device 430 may be arranged inside the electronic device 400 such that at least a part of the display area thereof is exposed in the first direction (+Z) through the front structure 440.

According to an embodiment, the display device 430 may be provided between the first plate 441 of the front structure 440 and the support member 420 and may have a touch screen integrally provided thereon. In one example, the display device 430 may be electrically connected to a display circuit board (not illustrated). The display circuit board may be arranged in the inner space 405. The display circuit board may transmit electric signals for driving the display device 430.

An adhesive layer may be arranged between the display device 430 and the first plate 441 of the front structure 440 such that the two are attached to each other. The adhesive layer may be an adhesive agent, adhesive film, or an optically transparent adhesive layer. For example, the adhesive layer may be an acrylic resin-based adhesive. As another example, the adhesive layer may include silicon, air, foam, a membrane, an optically clear adhesive (OCA), sponge, rubber, ink, or polymer (PC or PET).

According to an embodiment, the display device 430 is in the shape of a rectangular plate, but is not limited thereto. Alternatively, the display device 430 may have side portions extended to correspond to the first side plate 442 and/or the second side plate 443. These side portions may also be exposed so that they may display content for the user. The length of the side portions may be variously changed and designed according to the shape of the front structure 440.

Figure 5A:
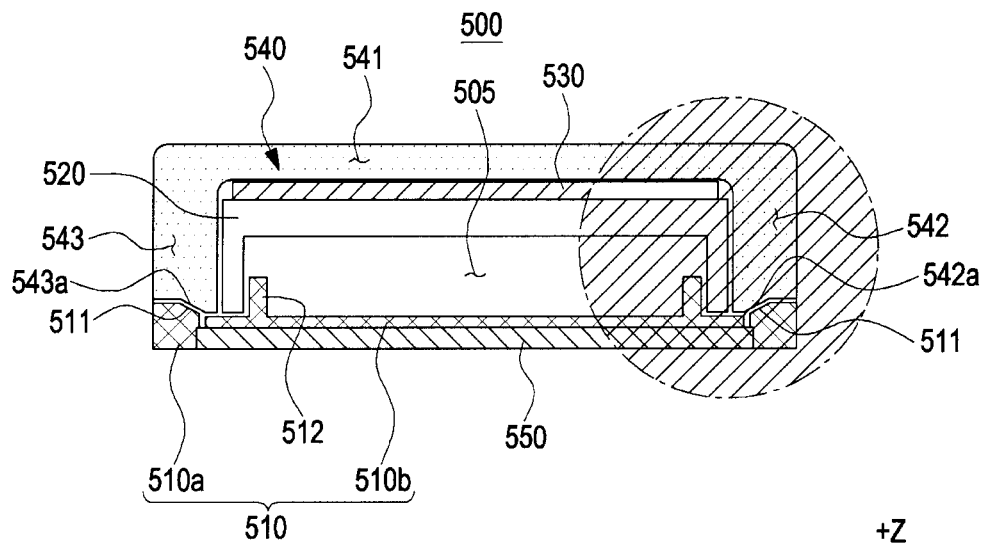
FIG. 5A is a sectional view of the electronic device 200 according to an embodiment, taken along A-A' of FIG. 2A.
Figure 5B:
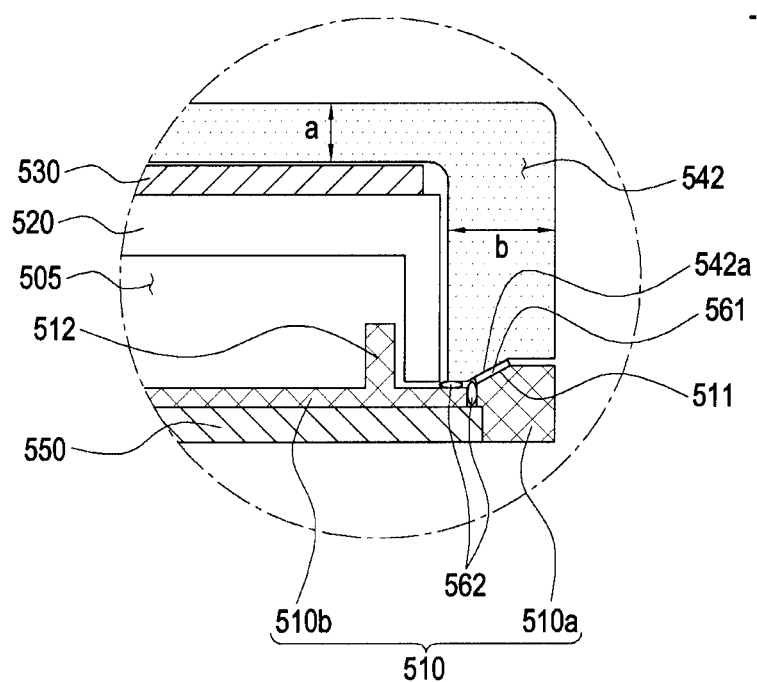
FIG. 5B is a magnified sectional view of a partial area of FIG. 5A.

FIG. 5A is a sectional view of the electronic device 200 according to an embodiment, taken along A-A' of FIG. 2A. FIG. 5B is a magnified sectional view of a partial area of FIG. 5A.

The electronic device 500 illustrated in FIG. 5A and FIG. 5B may be partially or entirely identical to the electronic devices 200 and 400 illustrated in FIG. 2A and FIG. 2B and in FIGS. 4A and 4B.

Referring to FIG. 5A and FIG. 5B, the electronic device 500 may include a housing 510, 540, and 550, a display device 530, and a support member 520. The housing may include rear structures 510 and 550 that at least partially cover the outer rear surface of the electronic device 500. The housing may also include a front structure 540. The electronic device 500 may include a support member 520 that supports various components inside the electronic device.

According to an embodiment, as shown in FIG. 5A, the display device 530, the support member 520, an inner space 505, the second plate 510, and the rear cover 550 may be sequentially arranged in the second direction (−Z) starting from the front structure 540. The front structure 540, the display device 530, and the support member 520 may be stacked above the inner space 505. The second plate 510 and the rear cover 550 may be stacked below the inner space 505.

According to an embodiment, the second plate 510 may include a first part 510a that forms the lower-end portion of the outer surface of the electronic device 500 and a second part 510b that extends from the first part 510a and forms the inner surface of the electronic device 500. For example, referring to FIG. 5B, a surface of the first part 510a, which faces the second direction (−Z), may be arranged to be collinear with the rear cover 550 of the electronic device. Thus, the two may form at least a part of the rear surface of the electronic device 500. A surface of the first part 510a, which faces the +X direction, may be arranged to face the first side plate 542 of the front structure 540 and may form at least a part of the side surface of the electronic device 500 together with the front structure 540.

According to an embodiment, the surface of the first portion 510a, which faces in the first direction (+Z), may include diagonally shaped end portions 511. The diagonally formed end portions 511 may be surface-to-surface contact-coupled with the front structure 540. For example, the diagonally shaped end portions 511 of the first part 510a may be manufactured to have sloping surfaces formed such that outer sides thereof are higher than the inner sides. The diagonally shaped end portions 511 of the first part 510a may be formed as a single sloping surface-shaped line along the longitudinal direction of the electronic device 500 (for example, in the Y-axis direction of the electronic device 200 in FIG. 2).

According to an embodiment, first attachment members 561 may be arranged on the sloping surfaces of the diagonally shaped end portions 511. The first attachment members 561 may be attached to end portions of the front structure 540 so as to maintain firm coupling between the second plate 510 and the front structure 540. For example, the first attachment members 561 may be a double-sided tape or an adhesive film. Compared with the ledges 411 of FIG. 4B, coupling between the second plate 510 and the front structure 540 using the diagonally shaped end portions 511 may provide for a better aesthetic appearance. For example, when seen from the outside the electronic device 500, the diagonally shaped end portions 511 of the first part 510a have naturally connected sloping surface structures, which may be more pleasing to the eye. In this example, the first attachment members 561 cannot be seen from the outside of the electronic device 500, thereby maintaining the aesthetic appearance.

According to an embodiment, second attachment members 562 may be arranged in the areas between the first part 510a and the second part 510b. By reinforcing the coupling between the first part 510a and the second part 510b, coupling between the front structure 540 and the second plate 510 can be supplemented. For example, the second attachment members 562 may be a double-sided tape or an adhesive film.

According to an embodiment, the second part 510b may be arranged to extend from the first part 510a, and may form the inner space 505, in which an internal electronic component or the like is mounted, together with the support member 520. The second plate 510 and the support member 520 may be arranged to entirely surround the inner space 505 so as to protect the electronic components or the like arranged in the inner space 505. The first surface of the second part 510b, which faces the first direction (+Z), may be arranged toward the interior of the inner space 505, and the second surface of the second part 510b, which faces the second direction (−Z), may be arranged to face the rear cover 550.

According to an embodiment, the first surface of the second part 510b may include protrusions 512 (for example, in rib shapes) arranged to extend and protrude in the first direction (+Z). For example, the protrusions 512 may be arranged at both ends of the second part 510b so as to form lines in the longitudinal direction. For example, referring to FIG. 5B, the protrusions 512 may be ledges that work in conjunction with the first surface of the second part 510b, and may be arranged to contact side surfaces of the support member 520. As another example, the arrangement of the protrusions 512 and the side surfaces of the support member 520 is not limited to an arrangement of mutual contact, and the protrusions 512 may be fixed to the side surfaces of the support member 520, or may be formed integrally therewith.

According to an embodiment, coupling between the diagonally shaped end portions 511 of the first part 510a and the protrusions 512 of the second part 510b may form recesses with a predetermined size on the first surface (the surface in the (+Z) direction) of the second plate 510a. For example, referring to FIG. 5B, the protrusions 512 of the second part 510b and the diagonally shaped end portions 511 of the first part 510a may form concave recesses. For example, side end portions of the support member 520 and the front structure 540 may be inserted into the recesses in parallel with each other. Although the above configuration corresponds to the structure of the shape of the right surface of the electronic device 500, the left surface of the electronic device 500 may also be similarly configured.

According to an embodiment, the front structure 540 may be exposed to the exterior of the electronic device 500 and may protect the display device 530. The front structure 540 may cover at least a partial area of the front surface of the electronic device 500 and at least a partial area of the side surface thereof. For example, the front structure 540 may include a first plate 541 that faces the first direction (+Z) and side plates (for example, a first side plate 542 and a second side plate 543) facing the +X direction and −X direction, respectively, which are perpendicular to the first direction (+Z). The first side plate 542 and the second side plate 543 may be arranged to face the opposite directions.

As another example, first side plate 542 and second side plate 543 may be integrally formed in the front structure 440 by bending the peripheral portions of the first plate 541 by about 90°. The first side plate 542 and second side plate 543 may be arranged to couple to the second plate 510. For example, as shown in FIG. 5A, the front structure 540 may be manufactured in a substantially "⊓" shape.

According to an embodiment, the first side plate 542 and the second side plate 543 of the front structure 540 may constitute at least about ⅔ of the outer side surface of the electronic device. However, the side extension configuration is not limited thereto, and the size of the first side plate 542 and the second side plate 543 may be changed depending on the design of the electronic device.

According to an embodiment, end portions of the first side plate 542 and the second side plate 543 of the front structure 540 may be inserted into the recesses formed by the second plate 510 and retained therein. For example, the lower end portions of the first side plate 542 and the second side plate 543 may be manufactured in shapes corresponding to those of the diagonally shaped end portions 511 formed on the first part 510a of the second plate 510 and may be attached through the first attachment members 561.

As shown in more detail in FIG. 5B, an end portion of the first side plate 542, for example, may have a surface facing the second direction (−Z). The surface may include diagonally shaped end portions 542a. The diagonally shaped end portions 542a may be coupled to the end portions 511 of the second plate 510, for example, and may support the front structure 540 such that the same does not deviate in outward directions (for example, in +X direction). For example, partial areas of the diagonally shaped end portions 542a of the first side plate 542 may be manufactured in the shape of sloping surfaces that become higher toward outward areas, and may be formed as a single sloping surface-shaped line along the longitudinal direction of the electronic device 500 (for example, in the Y-axis direction of the electronic device 200 in FIG. 2). When seen from the outside the electronic device 500, the sloping surface structure of the diagonally shaped end portions 542a may be more aesthetically pleasing. The first attachment members 561 attached to the sloping surfaces are not be directly visible, thereby maintaining the aesthetic appearance of the electronic device 500.

According to an embodiment, second attachment members 562 may be arranged in partial areas of first surfaces, which face the second direction (−Z), of the end portions of the first side plate 542 and may be coupled to the second part 510b of the second plate 510. The coupling through the second attachment members 562 may assist coupling between the front structure 540 and the second plate 510. For example, the second attachment members 562 may be a double-sided tape or an adhesive film.

According to an embodiment, the first plate 541 facing in the first direction (+Z), and the first side plate 542 and the second side plate 543, which face in the +X direction and −X direction, respectively, may be configured to have different thicknesses. For example, referring to FIG. 5B, provided that the thickness of the first plate 541 of the front structure 540 is defined as "a," and the thickness of the first side plate 542 is defined as "b," a may be less than b. As another example, assuming that the thickness of the first plate 541 of the front structure 540 is approximately 0.5 mm, the thickness of the first side plate 542 may be approximately 0.5 mm or larger. The increased thickness of the first side plate 542 and the second plate 534 may result in more rigidity for the housing of the electronic device 500. In addition, the increased thickness of the first side plate 542 and the second plate 534 also allows the first and second attachment members 561 and 562 to have more contact area.

According to an embodiment, referring to FIG. 5B, a side portion of the support member 520 may be arranged next to the interior surface of the first side plate 542, and the interior surface of the first side plate 542 and the side portion of the support member 520 may be arranged to face each other. As another example, although the configuration of coupling between the first side plate 542 and the first part 510a illustrates the shape of the right surface of the electronic device 500, the coupling between the second side plate 543 and the first part 510a, corresponding to the left surface of the electronic device 500, may also be similarly configured.

According to an embodiment, the rear cover 550 of the rear structure may be arranged on the outer surface of the electronic device 500 so as to protect internal components of the electronic device 500 or the like. For example, the rear cover 550 may be seated in a recess formed by the second plate 510. For example, the rear cover 550 may have a plate shape, and may be made of a material that can transmit radio waves or magnetic fields, such as tempered glass or synthetic resin. As another example, the rear cover 450 may be metallic.

Although an embodiment of the electronic device 500 including the rear cover 550 has been described, the electronic device 500 is not limited thereto, and it can be understood from the present disclosure that the second plate 510 can be manufactured so as to substantially cover the rear surface of the electronic device as illustrated in FIG. 3A and FIG. 3B. The second plate 510 can also form at least a part (for example, side and rear surfaces) of the housing of the electronic device 500.

The configurations of the support member 520, the display device 530, and the rear cover 550 are identical to those of the support member 420, the display device 430, and the rear cover 450 in FIG. 4A and FIG. 4B, and repeated descriptions thereof will be omitted herein.

Figure 6A:
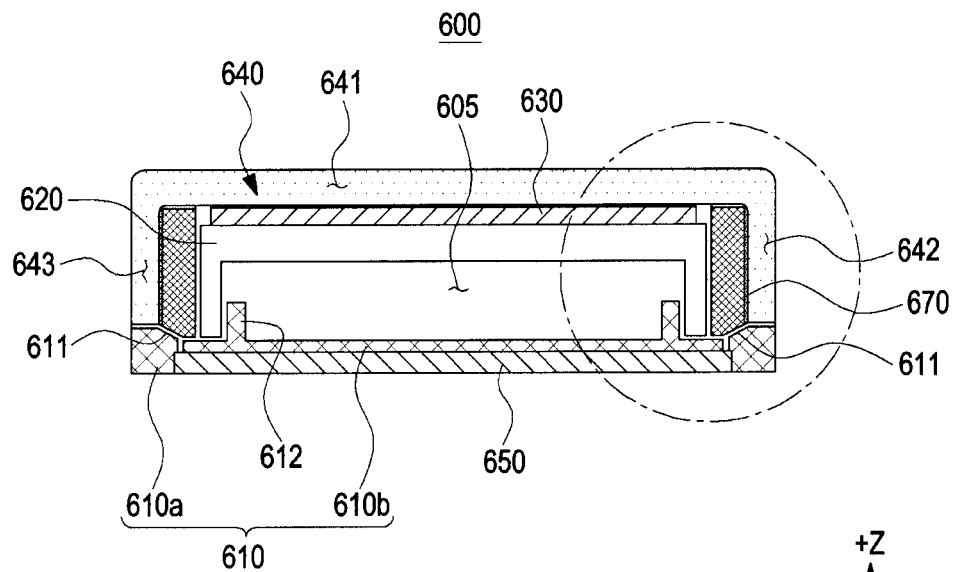
FIG. 6A is a sectional view of the electronic device 200 according to an embodiment, taken along A-A' of FIG. 2A.
Figure 6B:
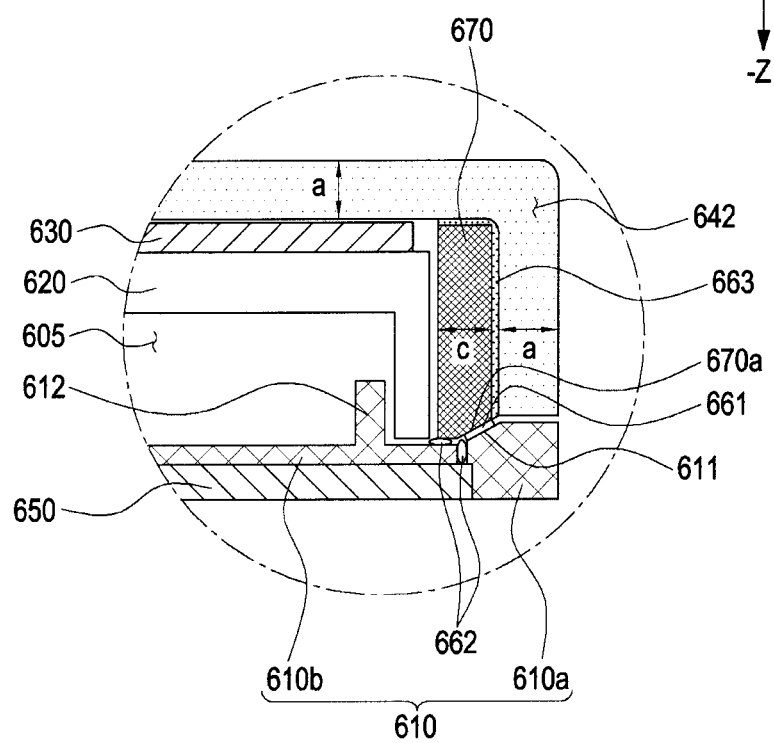
FIG. 6B is a magnified sectional view of a partial area of FIG. 6A.

FIG. 6A is a sectional view of the electronic device 200 according to an embodiment, taken along A-A' of FIG. 2A. FIG. 6B is a magnified sectional view of a partial area of FIG. 6A. The electronic device 600 illustrated in FIG. 6A and FIG. 6B may be partially or entirely identical to the electronic device 500 illustrated in FIG. 5A and FIG. 5B.

Referring to FIG. 6A and FIG. 6B, the electronic device 600 may include a housing 610, 640, and 650, a display device 630, and a support member 620. The housing may include rear structures 610 and 650 that at least partially cover the outer rear surface of the electronic device 600. The housing may also include a front structure 640. The electronic device may include a support member 620 that supports various components inside the electronic device.

According to an embodiment, as shown in FIG. 6A, a display device 630, the support member 620, an inner space 605, the second plate 610, and a rear cover 650 may be sequentially arranged in the second direction (−Z) starting from the front structure 640. The front structure 640, the display device 630, and the support member 620 may be stacked above the inner space 605. The second plate 610 and the rear cover 650 may be stacked below the inner space 605.

The configurations of the second plate 610 and the support member 620, the configuration of the display device 630, and the configuration of the rear cover 650, according to an embodiment illustrated in FIG. 6A and FIG. 6B, are identical or similar to the configurations of the second plate 510 and the support member 520, the configuration of the display device 530, and the configuration of the rear cover 550 illustrated in FIG. 5A and FIG. 5B. Therefore, repeated descriptions thereof will be omitted, and the differences between the figures will now be described.

According to an embodiment, the second plate 610 may include a first part 610a that forms the lower-end portion of the outer surface of the electronic device 600 and a second part 610b that extends from the first part 610a and forms the inner surface of the electronic device 600.

According to an embodiment, a surface of the first portion 610a, which faces in the first direction (+Z), may include diagonally shaped end portions 611. The diagonally formed end portions 611 may be surface-to-surface contact-coupled with side members 670 arranged inside the front structure 640. The diagonally formed end portions 611 may support the front structure 640 attached to the side members 670 from deviating in outward directions (for example, in the +X direction). For example, the diagonally shaped end portions 611 of the first part 610a may be manufactured to have sloping surfaces formed such that outer sides thereof are higher than the inner sides, and may be formed as a single sloping surface-shaped line along the longitudinal direction of the electronic device 600 (for example, in the Y-axis direction of the electronic device 200 in FIG. 2).

According to an embodiment, first attachment members 661 may be arranged on the sloping surfaces of the diagonally shaped end portions 611, and the end surfaces of the side members 670 may be attached to the first attachment members 661 so as to maintain coupling between the second plate 610 and the side members 670. For example, the first attachment members 661 may be a double-sided tape or an adhesive film. The side members 670 may be made of glass, polymer, metal, or the like. As another example, third attachment members 663 may be arranged between the side members 670 and the front structure 640 so as to maintain the coupling between the side members 670 and the front structure 640. For example, the third attachment members 663 may be a double-sided tape or an adhesive film. As another example, when the display device 630 is arranged to extend to the side of the electronic device 600, the third attachment members 663 may include optical members such as an optically clear adhesive (OCA) or an optically clear resin (OCR).

As another example, second attachment members 662 may be arranged between in the areas between the first part 610a and the second part 610b. By reinforcing the coupling between the first part 610a and the second plate 610, coupling between the front structure 640 and the second plate 610 can be supplemented. For example, the second attachment members 662 may be a double-sided tape or an adhesive film.

The structures for coupling between the second plate 610 and the side members 670 through the diagonally shaped end portions 611 may provide the electronic device 600 with a more aesthetically-pleasing appearance. For example, when seen from the outside the electronic device 600, the diagonally shaped end portions 611 of the first part 610a have naturally connected sloping surface structures that are more aesthetically please. In this example, the first attachment members 661 attached to the sloping surfaces may not be visible, thereby maintaining the aesthetic appearance.

According to an embodiment, the front structure 640 may be exposed to the exterior of the electronic device 600 and may protect the display device 630. The front structure 640 may cover at least a partial area of the front surface of the electronic device 600 and at least a partial area of the side surface thereof. For example, the front structure 640 may include a first plate 641 that faces the first direction (+Z) and side plates (for example, a first side plate 642 and a second side plate 643) facing the +X direction and −X direction, which are perpendicular to the first direction (+Z). The first side plate 642 and the second side plate 643 may be arranged to face the opposite directions.

According to an embodiment, referring to FIG. 6B, separate side members 670 may be arranged next to the interior surface of the front structure 640, and the lower end portions of the side members 670 may have structures corresponding to the diagonally shaped end portions 611 of the first part 610a. End portions of the side members 670 having partial areas of surfaces facing in the second direction (−Z) may have diagonally shaped end portions 670a formed thereon, and may be coupled to the end portions 611 of the first part 610a through the first attachment members 661. The other ends of the side members 670 may be arranged to face a partial area of the first plate 641, and the side members 670 may be coupled through the third attachment members 663.

According to an embodiment, the diagonally shaped end portions 670a of the side members 670 may be coupled to the end portions 611 of the second plate 610, and may support the front structure 640 such that the same does not deviate in outward directions. For example, the diagonally shaped end portions 670a of the side members 670 may be manufactured in the shape of sloping surfaces whose outer surfaces are higher than the inner surfaces. The diagonally shaped end portions 670a may be further formed as a single sloping surface-shaped line along the longitudinal direction of the electronic device 600.

According to an embodiment, the first plate 641 facing in the first direction (+Z) and the first side plate 642 and the second side plate 643, which face in the +X direction and −X direction, respectively, may be configured to have the same thickness. As a result of the side members 670 arranged inside corners of the first side plate 642 and/or the second side plate 643, the side thickness of the front structure 640 of the electronic device 600 may be larger than the thickness of the first plate 641. For example, referring to FIG. 6B, provided that the thickness of the first plate 641 of the front structure 640 is defined as "a," the thickness of the first side plate 642 is defined as "a," and the thickness of the side members 670 is defined as "c," a+c is greater than a. As another example, assuming that the thickness of the first plate 641 of the front structure 640 is approximately 0.5 mm, the side thickness of the electronic device 600 formed by the side members 670 and the first side plate 642 may be approximately 0.5 mm or larger. The increased thickness at the sides of the electronic device 600 may result in more rigidity for the housing of the electronic device 600. In addition, the increased thickness of the first side plate 642 plus the side member 670 also allows the first and second attachment members 661 and 662 to have more contact area.

Although the structure of direct assembly between the front structure 640 and the rear structure 610 and 650 in FIG. 6 illustrates the shape of the right surface of the electronic device 600, the left surface of the electronic device 600 may also be similarly configured.

According to an embodiment, the rear cover 650 of the rear structure may be arranged on the outer surface of the electronic device 600 so as to protect internal components of the electronic device 600 or the like. For example, the rear cover 650 may be seated in a recess formed by the second plate 610. For example, the rear cover 650 may have a plate shape, and may be made of a material that can transmit radio waves or magnetic fields, such as tempered glass or synthetic resin. As another example, the rear cover 450 may be metallic.

Although an embodiment of the electronic device 600 including the rear cover 650 has been described, the electronic device 600 is not limited thereto, and it is also possible to integrally manufacture a second plate 610 so as to substantially cover the rear surface of the electronic device as illustrated in FIG. 3A and FIG. 3B. The second plate 610 can also form at least a part (for example, side and rear surfaces) of the housing of the electronic device 600.

Figure 7A:
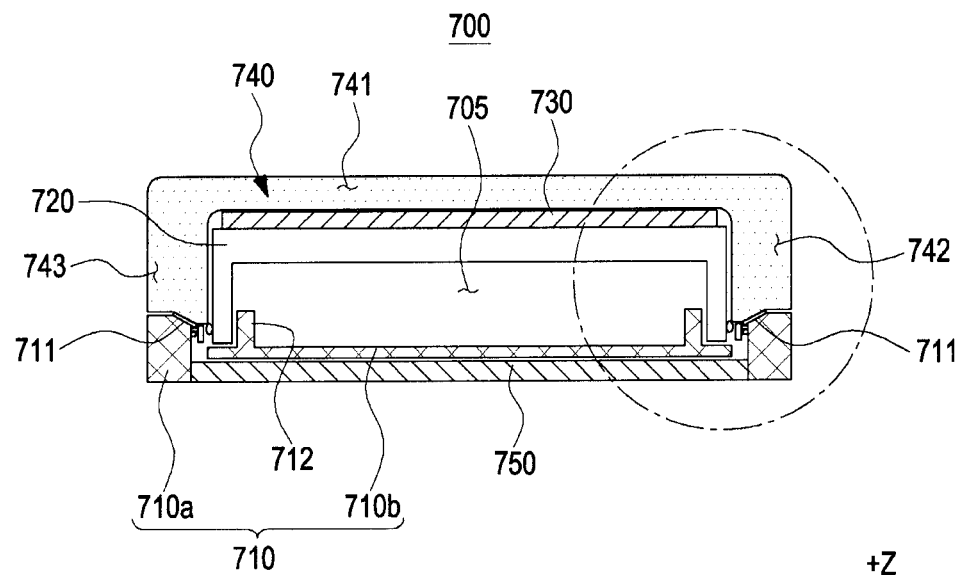
FIG. 7A is a sectional view of the electronic device 200 according to an embodiment, taken along A-A' of FIG. 2A.
Figure 7B:
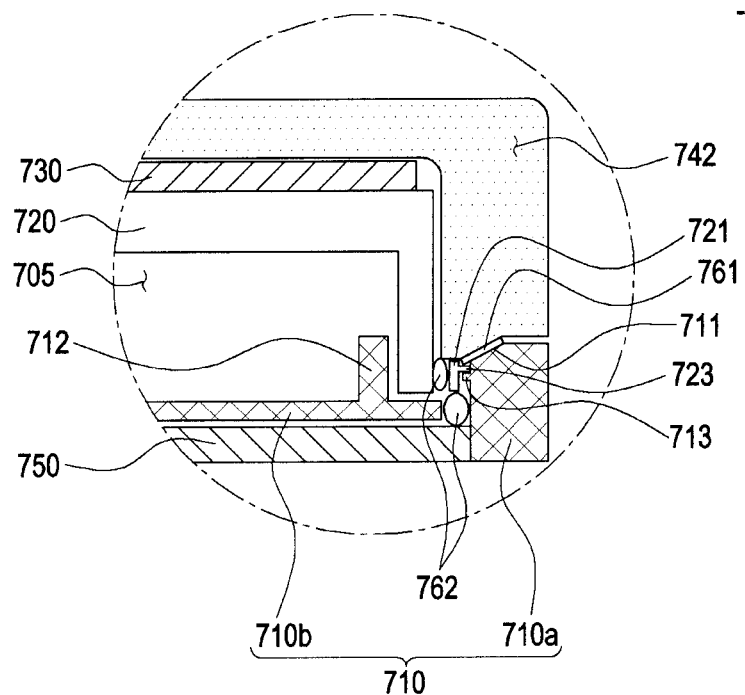
FIG. 7B is a magnified sectional view of a partial area of FIG. 7A.

FIG. 7A is a sectional view of the electronic device 200 according to an embodiment, taken along A-A' of FIG. 2A. FIG. 7B is a magnified sectional view of a partial area of FIG. 7A. The electronic device 700 illustrated in FIG. 7A and FIG. 7B may be partially or entirely identical to the electronic device 500 illustrated in FIG. 5A and FIG. 5B.

Referring to FIG. 7A and FIG. 7B, the electronic device 700 may include a housing 710, 740, and 750, a display device 730, and a support member 720. The housing may include rear structures 710 and 750 that partially cover the outer rear surface of the electronic device 700. The housing may also include a front structure 740. The electronic device 700 may include a support member 720 that supports various components inside the electronic device.

According to an embodiment, as shown in FIG. 7A, a display device 730, the support member 720, an inner space 705, a second plate 710, and a rear cover 750 may be sequentially arranged in the second direction (−Z) starting from the front structure 740. The front structure 740, the display device 730, and the support member 720 may be stacked above the inner space 705. The second plate 710 and the rear cover 750 may be stacked below the inner space 705.

According to an embodiment, the second plate 710 may include a first part 710a that forms the lower-end portion of the outer surface of the electronic device 700 and a second part 710b that extends from the first part 710a and forms the inner surface of the electronic device 700.

For example, referring to FIG. 7B, a surface of the first part 710a, which faces in the second direction (−Z), may be arranged to be collinear with the rear cover 750 of the electronic device 700. Thus, the two may form the rear surface of the electronic device 700. A surface of the first part 710a, which faces the +X direction, may be arranged to face the first side plate 742 of the front structure 740 and may form the side surface of the electronic device 700 together with the front structure 740.

According to an embodiment, the surface of the first portion 710a, which faces in the first direction (+Z), may include diagonally shaped end portions 711. The diagonally formed end portions 711 may be surface-to-surface contact-coupled with the front structure 740 and may support the front structure 740 such that the same does not deviate in outward directions (for example, in the second direction (+X)). For example, the diagonally shaped end portions 711 of the first part 710a may be manufactured to have sloping surfaces formed such that outer sides thereof are higher than the inner sides. The diagonally shaped end portions 711 may be formed as a single sloping surface-shaped line along the longitudinal direction of the electronic device 700 (for example, in the Y-axis direction of the electronic device 200 in FIG. 2).

According to an embodiment, coupling hooks 713 may be formed on the surface of the first part 710a, which faces in the −X direction, so as to protrude in the −X direction. The coupling hooks 713 may be coupled with coupling members 723 protruding from the support member 720, thereby inducing coupling between the second plate 710 and the support member 720. For example, the coupling hooks 713 may be formed as a single line along the longitudinal direction of the electronic device 700 (for example, in the Y-axis direction of the electronic device 200 in FIG. 2).

According to an embodiment, first attachment members 761 may be arranged on the sloping surfaces of the diagonally shaped end portions 711, and the first attachment members 761 may be attached to the end portions of the front structure 740, thereby maintaining the coupling between the second plate 710 and the front structure 740.

According to an embodiment, second attachment members 762 may be arranged in areas between the first part 710a and the second part 710b so as to couple the first part 710a and the second part 710b and to supplement the coupling with the front structure 740. For example, the second attachment members 762 may be a double-sided tape or an adhesive film.

According to an embodiment, the second part 710b may be arranged to extend from the first part 710a, and may form the inner space 705, in which an internal electronic component or the like is mounted, together with the support member 720. The first surface of the second part 710b, which faces the first direction (+Z), may be arranged toward the interior of the inner space, and the second surface thereof, which faces the second direction (−Z), may be arranged to face the rear cover 750.

According to an embodiment, the first surface of the second part 710b may include protrusions 712 (for example, in rib shapes) arranged to extend and protrude in the first direction (+Z). The protrusions 712 may be arranged at both ends of the second part 710b so as to form lines in the longitudinal direction. For example, referring to FIG. 7B, the protrusions 712 may have ledge shapes that are coupled to the side surface of the second plate 710.

According to an embodiment, coupling between the diagonally shaped end portions 711 of the first part 710a and the protrusions 712 of the second part 710b may form recesses with a predetermined size on the first surface (the surface in the (+Z) direction) of the second plate 710a. For example, referring to FIG. 7B, the protrusions 712 of the second part 710b and the diagonally shaped end portions 711 of the first part 710a may form concave recesses. Side end portions of the support member 720 and the front structure 740 may be inserted into the recesses while they are in parallel with each other. This way, the side end portions of the support member 720 and the front structure 740 may be prevented from deviating leftward/rightward. Second attachment members 762 may be arranged in partial areas of the side surfaces of the support member 720 and attached to the interior surface of the front structure 740, thereby implementing direct assembly of the front structure 740 and the housing 710. Although the above configuration corresponds to the structure of the shape of the right surface of the electronic device 700, the left surface of the electronic device 700 may also be similarly configured.

According to an embodiment, the support member 720 may be arranged inside the electronic device 700 so as to provide the inner space 705 together with the second plate 710. The first surface of the support member 720, which faces the first direction (+Z), may have a seating surface formed thereon, on which the display device 730 is seated. This way, the support member 720 can support the front structure 740 together with the display device 730.

According to an embodiment, the support member 720 may have side portions formed to extend from both ends (i.e. left and right) of the seating surface in the downward direction (for example, in the second direction (−Z)). For example, as shown in FIG. 7A, the support member 720 may be manufactured in a "⊓" shape. As described above, the two side portions may be inserted into the recesses formed by the protrusions 712 and the second surfaces 711 of the second plate 710 and be fixedly supported therein.

According to an embodiment, the lower-end areas in the sides of the support member 720 may include coupling members 723 that are fitted and coupled to the coupling hooks 713 of the second plate 710a. For example, referring to FIG. 7B, protruding structures 721 may be arranged in the lower-end areas of the support member 720 so as to protrude in the +X direction, and the protruding structures 721 may be arranged to extend to the lower portions of the first side plate 742 of the front structure 740. As another example, the protruding structures 721 may include coupling members 723 that protrude in the +X direction, and the coupling members 723 may be manufactured in shapes corresponding to those of the coupling hooks 713.

According to an embodiment, the protruding structures 721 may be partially disconnected from the support member 720. Second attachment members 762 may be arranged between the protruding structures 721 and the support member 720. For example, the second attachment members 762 may be a double-sided tape or an adhesive film.

According to an embodiment, the front structure 740 may be exposed to the exterior of the electronic device 700 and may protect the display device 730. The front structure 740 may cover at least a partial area of the front surface of the electronic device 700 and at least a partial area of the side surface thereof. For example, the front structure 740 may include a first plate 741 that faces the first direction (+Z) and side plates (for example, a first side plate 742 and a second side plate 743) facing the +X direction and −X direction, respectively, which are perpendicular to the first direction (+Z). The first side plate 742 and the second side plate 743 may be arranged to face opposite directions.

As another example, the first side plate 742 and second side plate 743 may be integrally formed in the front structure 740 by bending the peripheral portions of the first plate 741 by at least by 90°. The first side plate 742 and the second side plate 743 may be arranged to couple to the second plate 710. For example, as shown in FIG. 7A, the front structure 740 may be manufactured in a substantially "⊓" shape.

According to an embodiment, lower end portions of the first side plate 742 and the second side plate 743 of the front structure 740 may be manufactured in shapes corresponding to those of the diagonally shaped end portions 711 formed on the first part 710*a* of the second plate 710 and may be attached through the first attachment members 761.

According to an embodiment, referring to FIG. 7B, a side portion of the support member 720 may be arranged next to the interior surface of the first side plate 742, and the interior surface of the first side plate 742 and the side portion of the support member 720 may be arranged to face each other.

According to an embodiment, the rear cover 750 may be arranged on the outer surface of the electronic device 700 so as to protect internal components of the electronic device 700 or the like. For example, the rear cover 750 may be seated in a recess formed by the second plate 710. For example, the rear cover 750 may have a plate shape, and may be made of a material such as tempered glass or synthetic resin, that can transmit radio waves or magnetic fields. As another example, the rear cover 750 may be metallic.

Although an embodiment of the electronic device 700 including the rear cover 750 has been described, the electronic device 700 is not limited thereto, and it can be understood from the present disclosure that the second plate 710 can be manufactured so as to substantially cover the rear surface of the electronic device as illustrated in FIG. 3A and FIG. 3B. The second plate 710 can also form at least a part of the outer surface (for example, side and rear surfaces) of the electronic device 700.

Figure 8A:
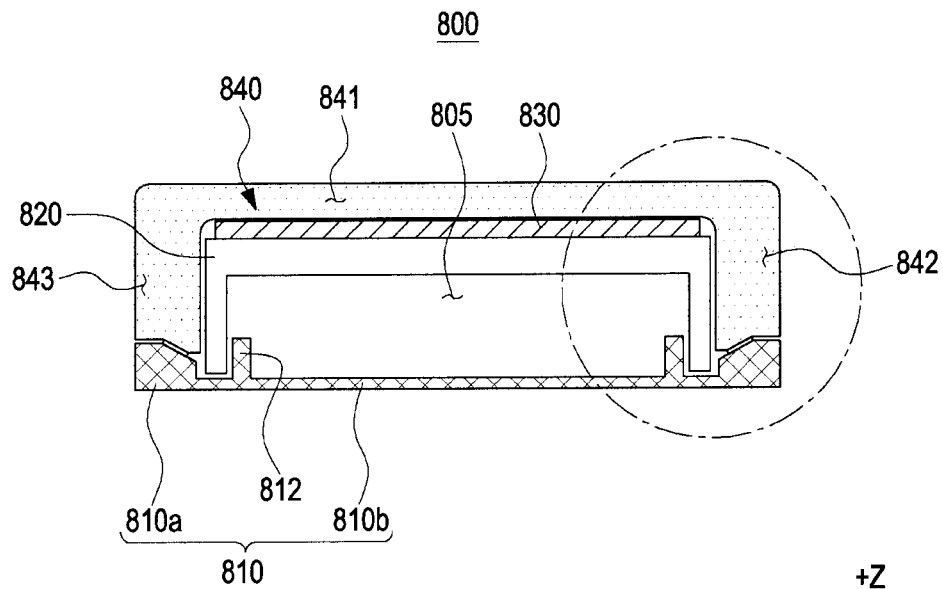
FIG. 8A is a sectional view of the electronic device 300 according to an embodiment, taken along B-B' of FIG. 3A.
Figure 8B:
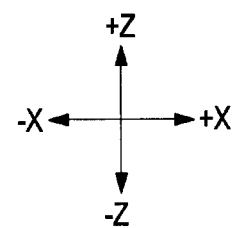
FIG. 8B is a magnified sectional view of a partial area of FIG. 8A.
Figure 8B:
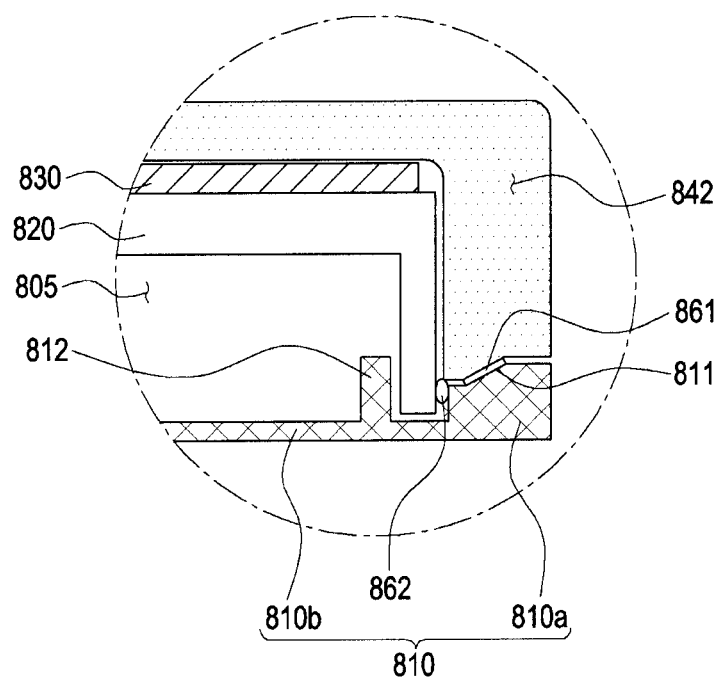

FIG. 8A is a sectional view of the electronic device 300 according to an embodiment, taken along B-B' of FIG. 3A. FIG. 8B is a magnified sectional view of a partial area of FIG. 8A.

Referring to FIG. 8A and FIG. 8B, the electronic device 800 may include a housing 810, 840, and 850, a display device 830, and a support member 820. The housing may include rear structures 810 and 850 that at least partially cover the outer rear surface of the electronic device 800. The housing 410, 440, 450 may also include a front structure 840. The electronic device may include a support member 820 that supports various components inside the electronic device.

The configurations of the second plate 810, the support member 820, the display device 830, and the front structure 840 according to an embodiment illustrated in FIG. 8A and FIG. 8B are identical or similar to the configurations of the second plate 710, the support member 720, the display device 730, and the front structure 740 illustrated in FIG. 7A and FIG. 7B. Therefore, repeated descriptions thereof will be omitted, and differences between the drawings will now be described.

According to an embodiment, the second plate 810 may include a first part 810*a* that forms the lower-end portion of the outer surface of the electronic device 800 and a second part 810*b* that extends from the first part 810*a* and forms the rear surface of the electronic device 800. The first part 810*a* and the second part 810*b* may be integrally configured so as to cover at least a part of the side surface of the electronic device and the rear surface of the electronic device. For example, referring to FIG. 8B, a surface of the first part 810*a*, which faces in the second direction (−Z), may constitute the rear surface of the electronic device 800. A surface of the first part 810*a*, which faces in the +X direction, may be arranged to be collinear with the second surface 842 of the front structure 840 so as to form the side surface of the electronic device 800 together with the front structure 840.

According to an embodiment, the surface of the first portion 810*a*, which faces in the first direction (+Z), may include diagonally shaped end portions 811. The diagonally formed end portions 811 may be surface-to-surface contact-coupled with the front structure 840 and may support the front structure 840 such that the front structure 840 does not deviate in outward directions (for example, in the +X direction). For example, the diagonally shaped end portions 811 of the first part 810*a* may be manufactured to have sloping surfaces formed such that outer sides thereof are higher than the inner sides. The diagonally shaped end portions 811 may be formed as a single sloping surface-shaped line along the longitudinal direction of the electronic device 800.

According to an embodiment, the second part 810*b* may be arranged to extend from the first part 810*a*, and may form an inner space 805, in which an internal electronic component or the like is mounted, together with the support member 820. The second plate 810 and the support member 820 may be formed to entirely cover and to protect the electronic component or the like arranged in the inner space 805.

According to an embodiment, the first surface of the second part 810*b* may include protrusions 812 arranged to extend and protrude in the first direction (+Z). For example, the protrusions 812 may be arranged at both ends of the second part 810*b* so as to form lines in the longitudinal direction. Referring to FIG. 8B, the protrusions 812 may have ledge shapes.

According to an embodiment, the rear cover 750 of FIG. 7B is replaced with the second plate 810 such that, for example, the second part 810*b* directly covers the rear surface of the electronic device 800. As a result, the inner space 805 in which electronic components or the like are mounted is expanded, and, since there is no need to manufacture a separate rear cover, manufacturing costs can be reduced. In this example, the exterior of the electronic device 800 is entirely covered by the three-surfaces of the front structure 840 and the second plate 810, thereby providing a simple and aesthetically-pleasing design.

An electronic device according to an embodiment may include: a housing including a front structure (for example, front structure 440 in FIG. 4) and a rear structure (for example, rear structure 410 and 450 in FIG. 4) attached to each other, the front structure (for example, front structure 440 in FIG. 4) of the housing including a first plate (for example, first plate 441 in FIG. 4) facing a first direction and a side plate (for example, side plates 442 and 443 in FIG. 4) extending from the first plate, the first plate having a first thickness, the side plate having a second thickness larger than the first thickness, the side plate (for example, side plates 442 and 443 in FIG. 4) including a first surface (for example, ledges 442*a* and 443*a* in FIG. 4) facing a peripheral portion of the rear structure (for example, rear structure 410 and 450 in FIG. 4), the rear structure (for example, rear structure 410 and 450 in FIG. 4) including a second plate (for example, second plate 410 in FIG. 4) facing a second direction opposite the first direction and a second surface (for example, ledge 411 in FIG. 4) facing the first surface. The first surface may be facing a third direction, the second surface may be facing a fourth direction, and the third and fourth directions may be different from the first and second directions, respectively. The electronic device may further include a touch screen display (for example, display device 430 in FIG. 4) having at least a part exposed through at least a part of the first plate.

According to an embodiment, the third direction may be at an acute angle with respect to the second direction, and may be at an obtuse angle with respect to the first direction.

According to an embodiment, the fourth direction may be at an obtuse angle with respect to the second direction, and may be at an acute angle with respect to the first direction.

According to an embodiment, the side plate may include one or more layers.

According to an embodiment, the front structure may be made of glass.

According to an embodiment, the peripheral portion of the rear structure may be made of a metallic material, and the second plate may be a glass plate.

An electronic device according to an embodiment may include: a front structure (for example, front structure 540 in FIG. 5) including a first plate (for example, first plate 541 in FIG. 5) facing a first direction, a first side plate (for example, first side plate 542 in FIG. 5) perpendicular to the first plate, and a second side plate (for example, second side plate 543 in FIG. 5) perpendicular to the first plate; a rear structure (for example, rear structure 510 and 550 in FIG. 5) coupled to end portions of the first and second side plates; a support member (for example, support member 520 in FIG. 5) arranged inside the front structure so as to support the front structure, the support member having a shape corresponding to the front structure and is coupled to the rear structure; and a display device (for example, display device 530 in FIG. 5) arranged between the front structure and the rear structure so as to display information through the front structure. The rear structure may include one or more first end portions (end portion 511 in FIG. 5) having varying heights in the first direction, and the first side plate and the second side plate of the front structure may each include one or more second end portions (for example, end portions 542*a* and 543*a* in FIG. 5) having varying heights corresponding to the one or more first end portions, so as to be coupled to the one or more first end portions.

According to an embodiment, the rear structure may include a first part that forms two end-portion areas in which the one or more first end portions are arranged, and a second part arranged to extend from the first part, the second part may include protrusions protruding in the first direction.

According to an embodiment, the one or more first end portions may include a first ledge structure that is higher towards an exterior of the rear structure, and the one or more second end portions may include a second ledge structure corresponding to the first ledge structure.

According to an embodiment, the one or more first end portions may include a diagonally shaped end portion having a sloping surface that is higher towards an exterior of the rear structure, and the one or more second end portions may include an end portion structure corresponding to the diagonally shaped end portions.

According to an embodiment, the one or more first end portions of the first part and the protrusions of the second part may be arranged to form recesses that receive at least portions of side portions of the support member and the one or more second end portions.

According to an embodiment, the electronic device may further include first attachment members arranged between the diagonally shaped end portion and the end portion structure so as to couple the rear structure and the front structure.

According to an embodiment, the electronic device may further include a second attachment member arranged between the first part and the second part of the rear structure so as to couple the first part and the second part or arranged between the second part of the rear structure and a lower end portion of the front structure so as to couple the rear structure and the front structure.

According to an embodiment, the one or more first end portions, the one or more second end portions, and the protrusions may be formed as one or more lines along a longitudinal direction of the electronic device.

According to an embodiment, the first side plate and the second side plate of the front structure may have a thickness larger than a thickness of the first plate.

According to an embodiment, the first part of the rear structure may include coupling hooks protruding in a direction perpendicular to the first direction, and the coupling hooks may be coupled to protruding structures formed on the side portions of the support member.

According to an embodiment, the electronic device may further include coupling members disposed between the side portions of the support member and the protruding structures.

An electronic device (for example, electronic device 600 in FIG. 6) according to an embodiment may include: a front structure (for example, front structure 640 in FIG. 6) including a first plate (for example, first plate 641 in FIG. 6) facing a first direction, a first side plate (for example, first side plate 642 in FIG. 6) perpendicular to the first plate, and a second side plate (for example, second side plate 643 in FIG. 6) perpendicular to the first plate; a rear structure (for example, rear structure 610 and 650 in FIG. 6) coupled to end portions of the first and second side plates; a support member (for example, support member 620 in FIG. 6) arranged inside the front structure so as to support the front structure, the support member having a shape corresponding to the front structure and is coupled to the rear structure; one or more side members (for example, side members 670 in FIG. 6) arranged between the first side plate and the second side plate of the front structure and side portions of the support member, respectively; and a display device (for example, display device 630 in FIG. 6) arranged between the front structure and the support member so as to display information through the front structure. The rear structure may include one or more first end portions (for example, end portions 611 in FIG. 6) having varying heights in the first direction, and the side members may include one or more second end portions (for example, end portions 670*a* in FIG. 6) having varying heights corresponding to the one or more first end portions, so as to be coupled to the first end portions.

According to an embodiment, the one or more first end portions may include a diagonally shaped end portion having a sloping surface that is higher towards an exterior of the rear structure, and the one or more second end portions may include an end portion structure corresponding to the diagonally shaped end portion.

According to an embodiment, the electronic device may further include attachment members arranged between the side members and the front structure, and the side members may have a thickness different from a thickness of the front structure.

While the present disclosure has been shown and described with reference to certain embodiments thereof, it will be apparent to those skilled in the art that the present disclosure is not limited to these embodiments, and various changes in form and details may be made therein without departing from the spirit and scope of the present disclosure as defined by the appended claims.

What is claimed is:

1. An electronic device comprising:
   a housing including:
   a front structure and a rear structure attached to each other,
   the front structure including a first plate facing a first direction and a side plate extending from the first plate, the first plate having a first thickness, the side plate having second thickness larger than the first thickness, the side plate including a first surface facing a peripheral portion of the rear structure,
   the rear structure including a second plate facing a second direction opposite the first direction and a second surface facing the first surface, wherein the first surface is facing a third direction, the second surface is facing a fourth direction, and wherein the third and the fourth directions are different from the first and second directions, respectively; and
   a touch screen display having at least a part exposed through at least a part of the first plate,
   wherein the rear structure include a first part that forms two end-portion areas in the second plate, and a second part arranged to extend from the first part, the second part includes protrusions protruding in the first direction, and
   wherein the first part and the protrusions of the second part are arranged to form recesses that receive at least portions of the side plate.

2. The electronic device of claim 1, wherein the third direction is at an acute angle with respect to the second direction, and is at an obtuse angle with respect to the first direction.

3. The electronic device of claim 2, wherein the fourth direction is at an obtuse angle with respect to the second direction, and is at an acute angle with respect to the first direction.

4. The electronic device of claim 1, wherein the side plate comprises one or more layers.

5. The electronic device of claim 1, wherein the front structure is made of glass.

6. The electronic device of claim 1, wherein the peripheral portion of the rear structure is made of a metallic material, and the second plate is a glass plate.

7. An electronic device comprising:
   a front structure including a first plate facing a first direction, a first side plate perpendicular to the first plate, and a second side plate perpendicular to the first plate;
   a rear structure coupled to end portions of the first and second side plates;
   a support member arranged inside the front structure so as to support the front structure, the support member having a shape corresponding to the front structure and is coupled to the rear structure; and
   a display device arranged below the front structure and above the support member so as to display information through the front structure,
   wherein the rear structure includes one or more first end portions having varying heights in the first direction, and the first side plate and the second side plate each includes one or more second end portions having varying heights corresponding to the one or more first end portions, so as to be coupled to the one or more first end portions
   wherein the rear structure include a first part that forms two end-portion areas in which the one or more first end portions are arranged, and a second part arranged to extend from the first part, the second part includes protrusions protruding in the first direction, and
   wherein the one or more first end portions of the first part and the protrusions of the second part are arranged to form recesses that receive at least portions of side portions of the support member and the one or more second end portions.

8. The electronic device of claim 7, wherein the one or more first end portions include a diagonally shaped end portion having a sloping surface that is higher towards an exterior of the rear structure, and the one or more second end portions include an end portion structure corresponding to the diagonally shaped end portion.

9. The electronic device of claim 7, further comprising first attachment members arranged between a diagonally shaped end portion and the end portion structure so as to couple the rear structure and the front structure.

10. The electronic device of claim 9, further comprising a second attachment member arranged between the first part and the second part of the rear structure so as to couple the first part and the second part or arranged between the second part of the rear structure and a lower end portion of the front structure so as to couple the rear structure and the front structure.

11. The electronic device of claim 7, wherein the first side plate and the second side plate of the front structure have a thickness larger than a thickness of the first plate.

12. The electronic device of claim 7, wherein the one or more first end portions, the one or more second end portions, and the protrusions are formed as one or more lines along a longitudinal direction of the electronic device.

13. An electronic device comprising:
    a front structure including a first plate facing a first direction, a first side plate perpendicular to the first plate, and a second side plate perpendicular to the first plate;
    a rear structure coupled to end portions of the first and second side plates;
    a support member arranged inside the front structure so as to support the front structure, the support member having a shape corresponding to the front structure and is coupled to the rear structure;
    one or more side members arranged between the first side plate and the second side plate of the front structure and side portions of the support member, respectively; and
    a display device arranged below the front structure and above the support member so as to display information through the front structure,
    wherein the rear structure includes one or more first end portions having varying heights in the first direction, and the side members include one or more second end portions having varying heights corresponding to the one or more first end portions, so as to be coupled to the one or more first end portions.

14. The electronic device of claim 13, wherein the one or more first end portions include a diagonally shaped end portion having a sloping surface that is higher towards an exterior of the rear structure, and the one or more second end portions include an end portion structure corresponding to the diagonally shaped end portion.

* * * * *